US012787295B2

(12) United States Patent
Kajimoto et al.

(10) Patent No.: US 12,787,295 B2
(45) Date of Patent: Nov. 3, 2026

(54) MEMORY DEVICE AND METHOD FOR MANUFACTURING THEREFOR

(71) Applicant: SUNRISE MEMORY CORPORATION, San Jose, CA (US)

(72) Inventors: Minori Kajimoto, Toyko (JP); Takashi Hirotani, Kanagawa (JP); Masahiro Yoshihara, Yokohama (JP)

(73) Assignee: SUNRISE MEMORY CORPORATION, San Jose, CA (US)

(*) Notice: Subject to any disclaimer, the term of this patent is extended or adjusted under 35 U.S.C. 154(b) by 814 days.

(21) Appl. No.: 18/156,959

(22) Filed: Jan. 19, 2023

(65) Prior Publication Data

US 2023/0371266 A1 Nov. 16, 2023

(30) Foreign Application Priority Data

May 13, 2022 (JP) ................................ 2022-079389

(51) Int. Cl.

| | |
|---|---|
| ***H10B 51/20*** | (2023.01) |
| ***H10B 51/10*** | (2023.01) |
| ***H10B 51/30*** | (2023.01) |
| ***H10D 30/01*** | (2025.01) |
| ***H10D 30/67*** | (2025.01) |

(Continued)

(52) U.S. Cl.

CPC ............ *H10B 51/20* (2023.02); *H10B 51/10* (2023.02); *H10B 51/30* (2023.02); *H10D 30/031* (2025.01); *H10D 30/0415* (2025.01); *H10D 30/6755* (2025.01); *H10D 30/701* (2025.01); *H10W 20/435* (2026.01)

(58) Field of Classification Search

CPC ....... H10B 51/20; H10B 51/10; H10D 30/701

See application file for complete search history.

(56) References Cited

U.S. PATENT DOCUMENTS

| | | | |
|---|---|---|---|
| 4,213,139 | A | 7/1980 | Rao |
| 4,984,153 | A | 1/1991 | Kregness et al. |

(Continued)

FOREIGN PATENT DOCUMENTS

| | | | |
|---|---|---|---|
| CN | 111799263 | A | 10/2020 |
| JP | 2000339978 | A | 12/2000 |

(Continued)

OTHER PUBLICATIONS

Kim, Taeho , et al., "Effects of high pressure nitrogen annealing on ferroelectric Hf0.5Zr0.502 films", Appl. Phys. Lett. 112, 092906 https://doi.org/10.1063/1.5003369, Mar. 2, 2018, 5 pages.

(Continued)

*Primary Examiner* — Vincent Wall

(57) ABSTRACT

A memory device includes a stacked body of alternately arranged conductor-including layers and insulating films in the first direction and pillar bodies within the stacked body. Each pillar body includes first and second conductive pillars and an insulator pillar located between the first conductive pillar and the second conductive pillar. Each conductor-including layer includes a semiconductor member, an electrode film and a ferroelectric layer provided between the semiconductor member and the electrode film. The semiconductor members in the multiple conductor-including layers are separated from each other in the first direction.

15 Claims, 25 Drawing Sheets

(51) Int. Cl.
*H10D 30/69* (2025.01)
*H10W 20/41* (2026.01)

(56) References Cited

U.S. PATENT DOCUMENTS

| | | | |
|---|---|---|---|
| 5,388,246 | A | 2/1995 | Kasai |
| 5,583,808 | A | 12/1996 | Brahmbhatt |
| 5,646,886 | A | 7/1997 | Brahmbhatt |
| 5,656,842 | A | 8/1997 | Iwamatsu |
| 5,768,192 | A | 6/1998 | Eitan |
| 5,789,776 | A | 8/1998 | Lancaster et al. |
| 5,880,993 | A | 3/1999 | Kramer et al. |
| 5,915,167 | A | 6/1999 | Leedy |
| 6,040,605 | A | 3/2000 | Sano et al. |
| 6,049,497 | A | 4/2000 | Yero |
| 6,057,862 | A | 5/2000 | Margulis |
| 6,107,133 | A | 8/2000 | Furukawa et al. |
| 6,118,171 | A | 9/2000 | Davies et al. |
| 6,130,838 | A | 10/2000 | Kim et al. |
| 6,313,518 | B1 | 11/2001 | Ahn et al. |
| 6,314,046 | B1 | 11/2001 | Kamiya et al. |
| 6,362,508 | B1 | 3/2002 | Rasovaky et al. |
| 6,396,744 | B1 | 5/2002 | Wong |
| 6,434,053 | B1 | 8/2002 | Fujiwara |
| 6,580,124 | B1 | 6/2003 | Cleeves et al. |
| 6,587,365 | B1 | 7/2003 | Salling |
| 6,627,503 | B2 | 9/2003 | Ma |
| 6,744,094 | B2 | 6/2004 | Forbes |
| 6,754,105 | B1 | 6/2004 | Chang et al. |
| 6,774,458 | B2 | 8/2004 | Fricke et al. |
| 6,873,004 | B1 | 3/2005 | Han et al. |
| 6,881,994 | B2 | 4/2005 | Lee et al. |
| 6,946,703 | B2 | 9/2005 | Ryu et al. |
| 7,005,350 | B2 | 2/2006 | Walker et al. |
| 7,177,977 | B2 | 2/2007 | Chen et al. |
| 7,223,653 | B2 | 5/2007 | Cheng et al. |
| 7,307,308 | B2 | 12/2007 | Lee |
| 7,465,980 | B2 | 12/2008 | Arimoto et al. |
| 7,489,002 | B2 | 2/2009 | Forbes et al. |
| 7,512,012 | B2 | 3/2009 | Kuo |
| 7,524,725 | B2 | 4/2009 | Chung |
| 7,542,348 | B1 | 6/2009 | Kim |
| 7,612,411 | B2 | 11/2009 | Walker |
| 7,709,359 | B2 | 5/2010 | Boes et al. |
| 7,804,145 | B2 | 9/2010 | Shimizu et al. |
| 7,872,295 | B2 | 1/2011 | Park et al. |
| 7,898,009 | B2 | 3/2011 | Wilson et al. |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,237,213 | B2 | 8/2012 | Liu |
| 8,242,504 | B2 | 8/2012 | Kim |
| 8,278,183 | B2 | 10/2012 | Lerner |
| 8,304,823 | B2 | 11/2012 | Boescke |
| 8,383,482 | B2 | 2/2013 | Kim et al. |
| 8,395,942 | B2 | 3/2013 | Samachisa et al. |
| 8,604,618 | B2 | 12/2013 | Cooney et al. |
| 8,630,114 | B2 | 1/2014 | Lue |
| 8,743,612 | B2 | 6/2014 | Choi et al. |
| 8,767,436 | B2 | 7/2014 | Scalia et al. |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,053,801 | B2 | 6/2015 | Sandhu et al. |
| 9,053,802 | B2 | 6/2015 | Mueller |
| 9,190,293 | B2 | 11/2015 | Wang et al. |
| 9,202,694 | B2 | 12/2015 | Konevecki et al. |
| 9,219,225 | B2 | 12/2015 | Karda et al. |
| 9,230,985 | B1 | 1/2016 | Wu et al. |
| 9,231,206 | B2 | 1/2016 | Tao et al. |
| 9,263,577 | B2 | 2/2016 | Ramaswamy et al. |
| 9,281,044 | B2 | 3/2016 | Ramaswamy et al. |
| 9,299,580 | B2 | 3/2016 | Kong et al. |
| 9,337,210 | B2 | 5/2016 | Karda et al. |
| 9,362,487 | B2 | 6/2016 | Inumiya et al. |
| 9,391,084 | B2 | 7/2016 | Lue |
| 9,412,752 | B1 | 8/2016 | Yeh et al. |
| 9,455,268 | B2 | 9/2016 | Oh et al. |
| 9,472,560 | B2 | 10/2016 | Ramaswamy et al. |
| 9,530,794 | B2 | 12/2016 | Ramaswamy et al. |
| 9,558,804 | B2 | 1/2017 | Mue |
| 9,620,605 | B2 | 4/2017 | Liang et al. |
| 9,633,944 | B2 | 4/2017 | Kim |
| 9,698,152 | B2 | 7/2017 | Peri |
| 9,711,529 | B2 | 7/2017 | Hu et al. |
| 9,748,172 | B2 | 8/2017 | Takaki |
| 9,786,684 | B2 | 10/2017 | Ramaswamy et al. |
| 9,799,761 | B2 | 10/2017 | Or-Bach et al. |
| 9,818,468 | B2 | 11/2017 | Warner |
| 9,818,848 | B2 | 11/2017 | Sun et al. |
| 9,830,969 | B2 | 11/2017 | Slesazeck et al. |
| 9,842,651 | B2 | 12/2017 | Harari |
| 9,865,680 | B2 | 1/2018 | Okumura et al. |
| 9,875,784 | B1 | 1/2018 | Li et al. |
| 9,876,018 | B2 | 1/2018 | Chavan et al. |
| 9,892,800 | B2 | 2/2018 | Harari |
| 9,911,497 | B1 | 3/2018 | Harari |
| 9,941,299 | B1 | 4/2018 | Chen et al. |
| 10,014,317 | B2 | 7/2018 | Peng |
| 10,038,092 | B1 | 7/2018 | Chen et al. |
| 10,043,567 | B2 | 8/2018 | Slesazeck et al. |
| 10,056,393 | B2 | 8/2018 | Schroeder et al. |
| 10,074,667 | B1 | 9/2018 | Higashi |
| 10,090,036 | B2 | 10/2018 | Van Houdt |
| 10,096,364 | B2 | 10/2018 | Harari |
| 10,121,553 | B2 | 11/2018 | Harari et al. |
| 10,157,780 | B2 | 12/2018 | Wu et al. |
| 10,211,223 | B2 | 2/2019 | Van Houdt et al. |
| 10,211,312 | B2 | 2/2019 | Van Houdt et al. |
| 10,217,667 | B2 | 2/2019 | Or-Bach et al. |
| 10,249,370 | B2 | 4/2019 | Harari |
| 10,254,968 | B1 | 4/2019 | Gazit et al. |
| 10,283,493 | B1 | 5/2019 | Nishida |
| 10,319,696 | B1 | 6/2019 | Nakano |
| 10,355,121 | B2 | 7/2019 | Or-Bach et al. |
| 10,373,956 | B2 | 8/2019 | Gupta et al. |
| 10,381,370 | B2 | 8/2019 | Shin et al. |
| 10,381,378 | B1 | 8/2019 | Harari |
| 10,395,737 | B2 | 8/2019 | Harari |
| 10,403,627 | B2 | 9/2019 | Van Houdt et al. |
| 10,418,377 | B2 | 9/2019 | Van Houdt et al. |
| 10,424,379 | B2 | 9/2019 | Slesazeck et al. |
| 10,431,596 | B2 | 10/2019 | Herner et al. |
| 10,438,645 | B2 | 10/2019 | Muell et al. |
| 10,460,788 | B2 | 10/2019 | Mueller |
| 10,475,812 | B2 | 11/2019 | Harari |
| 10,510,773 | B2 | 12/2019 | Ramaswamy et al. |
| 10,600,808 | B2 | 3/2020 | Schröder et al. |
| 10,608,008 | B2 | 3/2020 | Harari et al. |
| 10,608,011 | B2 | 3/2020 | Harari et al. |
| 10,608,012 | B2 | 3/2020 | Huang et al. |
| 10,622,051 | B2 | 4/2020 | Mueller et al. |
| 10,622,377 | B2 | 4/2020 | Harari et al. |
| 10,636,471 | B2 | 4/2020 | Ramaswamy et al. |
| 10,650,892 | B2 | 5/2020 | Noack |
| 10,651,153 | B2 | 5/2020 | Fastow et al. |
| 10,651,182 | B2 | 5/2020 | Morris et al. |
| 10,651,196 | B1 | 5/2020 | Sharangpani et al. |
| 10,692,837 | B1 | 6/2020 | Nguyen et al. |
| 10,692,874 | B2 | 6/2020 | Harari et al. |
| 10,700,093 | B1 | 6/2020 | Kalitsov et al. |
| 10,720,437 | B2 | 7/2020 | Yoo |
| 10,825,834 | B1 | 11/2020 | Chen |
| 10,872,905 | B2 | 12/2020 | Muel |
| 10,879,269 | B1 | 12/2020 | Zhang et al. |
| 10,896,711 | B2 | 1/2021 | Lee et al. |
| 10,937,482 | B2 | 3/2021 | Sharma et al. |
| 10,950,616 | B2 | 3/2021 | Harari et al. |
| 11,043,280 | B1 | 6/2021 | Prakash et al. |
| 11,133,329 | B2 | 9/2021 | Lue |
| 11,171,157 | B1 | 11/2021 | Lai et al. |
| 11,411,025 | B2 | 8/2022 | Lai et al. |
| 11,839,086 | B2 | 12/2023 | Petti et al. |
| 12,160,996 | B2 | 12/2024 | Petti et al. |

(56) References Cited

U.S. PATENT DOCUMENTS

2001/0030340 A1 10/2001 Fujiwara
2001/0053092 A1 12/2001 Kosaka et al.
2002/0012271 A1 1/2002 Forbes
2002/0028541 A1 3/2002 Lee et al.
2002/0051378 A1 5/2002 Ohsawa
2002/0193484 A1 12/2002 Albee
2003/0038318 A1 2/2003 Forbes
2004/0214387 A1 10/2004 Madurawe et al.
2004/0246807 A1 12/2004 Lee
2004/0262681 A1 12/2004 Masuoka et al.
2004/0262772 A1 12/2004 Ramanathan et al.
2004/0264247 A1 12/2004 Kim
2005/0128815 A1 6/2005 Ishikawa et al.
2005/0218509 A1 10/2005 Kipnis et al.
2005/0236625 A1 10/2005 Schuele et al.
2005/0280061 A1 12/2005 Lee
2006/0001083 A1 1/2006 Bhattacharyya
2006/0080457 A1 4/2006 Hiramatsu et al.
2006/0140012 A1 6/2006 Wan et al.
2006/0155921 A1 7/2006 Gorobets et al.
2006/0212651 A1 9/2006 Ashmore
2006/0261404 A1 11/2006 Forbes
2007/0012987 A1 1/2007 McTeer
2007/0023817 A1 2/2007 Dao
2007/0045711 A1 3/2007 Bhattacharyya
2007/0134876 A1 6/2007 Lai et al.
2007/0192518 A1 8/2007 Rupanagunta et al.
2008/0022026 A1 1/2008 Yang et al.
2008/0054346 A1 3/2008 Saitoh et al.
2008/0160765 A1 7/2008 Lee et al.
2008/0173930 A1 7/2008 Watanabe
2008/0178794 A1 7/2008 Cho et al.
2008/0212358 A1 9/2008 Mitsui
2008/0239812 A1 10/2008 Naofumi et al.
2008/0266960 A1 10/2008 Kuo
2008/0291723 A1 11/2008 Wang et al.
2008/0301359 A1 12/2008 Smith
2009/0057722 A1 3/2009 Masuoka et al.
2009/0140318 A1 6/2009 Dong
2009/0157946 A1 6/2009 Arya
2009/0237996 A1 9/2009 Kirsch et al.
2009/0242966 A1 10/2009 Son et al.
2009/0268519 A1 10/2009 Ishii
2009/0279360 A1 11/2009 Peter et al.
2009/0290442 A1 11/2009 Rajan
2009/0316487 A1 12/2009 Lee et al.
2010/0013001 A1 1/2010 Cho et al.
2010/0121994 A1 5/2010 Kim et al.
2010/0124116 A1 5/2010 Takashi et al.
2010/0128509 A1 5/2010 Kim et al.
2010/0148215 A1 6/2010 Schulze et al.
2010/0207185 A1 8/2010 Lee et al.
2010/0213527 A1 8/2010 Shim et al.
2010/0219392 A1 9/2010 Awaya et al.
2010/0254191 A1 10/2010 Son et al.
2010/0327413 A1 12/2010 Lee et al.
2011/0003418 A1 1/2011 Sakata et al.
2011/0044113 A1 2/2011 Kim
2011/0047325 A1 2/2011 Mishima
2011/0115011 A1 5/2011 Masuoka et al.
2011/0134705 A1 6/2011 Jones et al.
2011/0143519 A1 6/2011 Lerner
2011/0170266 A1 7/2011 Haensh et al.
2011/0208905 A1 8/2011 Shaeffer et al.
2011/0291176 A1 12/2011 Lee et al.
2011/0298013 A1 12/2011 Hwang et al.
2011/0309432 A1 12/2011 Ishihara et al.
2011/0310683 A1 12/2011 Gorobets
2012/0063223 A1 3/2012 Lee
2012/0146126 A1 6/2012 Lai et al.
2012/0182801 A1 7/2012 Lue
2012/0208347 A1 8/2012 Hwang et al.
2012/0223380 A1 9/2012 Lee et al.
2012/0243314 A1 9/2012 Takashi
2012/0307568 A1 12/2012 Banna et al.
2012/0327714 A1 12/2012 Lue
2013/0031325 A1 1/2013 Nakamoto et al.
2013/0126957 A1 5/2013 Higashitani et al.
2013/0256780 A1 10/2013 Kai et al.
2014/0015036 A1 1/2014 Fursin et al.
2014/0040698 A1 2/2014 Loh et al.
2014/0070289 A1 3/2014 Tanaka et al.
2014/0070290 A1 3/2014 Inumiya et al.
2014/0075135 A1 3/2014 Choi et al.
2014/0112075 A1 4/2014 Dunga et al.
2014/0117366 A1 5/2014 Saitoh
2014/0151774 A1 6/2014 Rhie
2014/0173017 A1 6/2014 Takagi et al.
2014/0213032 A1 7/2014 Kai et al.
2014/0229131 A1 8/2014 Cohen et al.
2014/0247674 A1 9/2014 Karda et al.
2014/0252443 A1 9/2014 Kawai et al.
2014/0328128 A1 11/2014 Louie et al.
2014/0340952 A1 11/2014 Ramaswamy et al.
2014/0355328 A1 12/2014 Mue et al.
2015/0054507 A1 2/2015 Gulaka et al.
2015/0098272 A1 4/2015 Kasolra et al.
2015/0113214 A1 4/2015 Sutardja
2015/0155876 A1 6/2015 Jayasena et al.
2015/0194440 A1 7/2015 Noh et al.
2015/0220463 A1 8/2015 Fluman et al.
2015/0249143 A1 9/2015 Sano
2015/0263005 A1 9/2015 Zhao et al.
2015/0340371 A1 11/2015 Lui
2015/0372099 A1 12/2015 Chen et al.
2016/0013156 A1 1/2016 Zhai et al.
2016/0019951 A1 1/2016 Park et al.
2016/0035711 A1 2/2016 Hu
2016/0086970 A1 3/2016 Peng
2016/0118404 A1 4/2016 Peng
2016/0141294 A1 5/2016 Peri et al.
2016/0225860 A1 8/2016 Karda et al.
2016/0276360 A1 9/2016 Doda et al.
2016/0300724 A1 10/2016 Levy et al.
2016/0314042 A1 10/2016 Plants
2016/0321002 A1 11/2016 Jung et al.
2016/0358934 A1 12/2016 Lin et al.
2017/0053906 A1 2/2017 Or-Bach et al.
2017/0062456 A1 3/2017 Sugino et al.
2017/0092370 A1 3/2017 Harari
2017/0092371 A1 3/2017 Harari
2017/0140807 A1 5/2017 Sun et al.
2017/0148517 A1 5/2017 Harari
2017/0148810 A1 5/2017 Kai et al.
2017/0194341 A1 7/2017 Yamada
2017/0213731 A1 7/2017 Yoon et al.
2017/0213821 A1 7/2017 Or-Bach et al.
2017/0358594 A1 12/2017 Lu et al.
2018/0006044 A1 1/2018 Chavan et al.
2018/0095127 A1 4/2018 Pappu et al.
2018/0108416 A1 4/2018 Harari
2018/0151419 A1 5/2018 Wu et al.
2018/0261613 A1 9/2018 Ariyoshi et al.
2018/0269229 A1 9/2018 Or-Bach et al.
2018/0286918 A1 10/2018 Bandyopadhyay et al.
2018/0314635 A1 11/2018 Alam
2018/0330791 A1 11/2018 Li et al.
2018/0331042 A1 11/2018 Manusharow et al.
2018/0342455 A1 11/2018 Nosho et al.
2018/0342544 A1 11/2018 Lee et al.
2018/0366471 A1 12/2018 Harari et al.
2018/0366485 A1 12/2018 Harari
2018/0366489 A1 12/2018 Harari et al.
2018/0374929 A1 12/2018 Yoo
2019/0006009 A1 1/2019 Harari
2019/0006015 A1 1/2019 Norman et al.
2019/0019564 A1 1/2019 Li et al.
2019/0067327 A1 2/2019 Herner et al.
2019/0148286 A1 5/2019 Or-Bach et al.
2019/0157296 A1 5/2019 Harari et al.
2019/0180821 A1 6/2019 Harari
2019/0206890 A1 7/2019 Harari et al.
2019/0214077 A1 7/2019 Oh et al.
2019/0237470 A1 8/2019 Mine et al.

(56) References Cited

U.S. PATENT DOCUMENTS

| | | | |
|---|---|---|---|
| 2019/0238134 A1 | 8/2019 | Lee et al. | |
| 2019/0244971 A1 | 8/2019 | Harari | |
| 2019/0259769 A1 | 8/2019 | Karda et al. | |
| 2019/0303042 A1 | 10/2019 | Kim et al. | |
| 2019/0304988 A1 | 10/2019 | Dong et al. | |
| 2019/0319044 A1 | 10/2019 | Harari | |
| 2019/0325945 A1 | 10/2019 | Linus | |
| 2019/0325964 A1 | 10/2019 | Harari | |
| 2019/0348424 A1 | 11/2019 | Karda et al. | |
| 2019/0355747 A1 | 11/2019 | Herner et al. | |
| 2019/0370117 A1 | 12/2019 | Fruchtman et al. | |
| 2020/0020718 A1 | 1/2020 | Harari et al. | |
| 2020/0051990 A1 | 2/2020 | Harari et al. | |
| 2020/0063263 A1 | 2/2020 | Yang et al. | |
| 2020/0065647 A1 | 2/2020 | Mulaosmanovic et al. | |
| 2020/0075631 A1 | 3/2020 | Dong | |
| 2020/0098738 A1 | 3/2020 | Herner et al. | |
| 2020/0098779 A1 | 3/2020 | Cernea et al. | |
| 2020/0098881 A1 | 3/2020 | Vellianitis | |
| 2020/0176468 A1 | 6/2020 | Herner et al. | |
| 2020/0201718 A1 | 6/2020 | Richter et al. | |
| 2020/0203378 A1 | 6/2020 | Harari et al. | |
| 2020/0219572 A1 | 7/2020 | Harari | |
| 2020/0243486 A1 | 7/2020 | Quader et al. | |
| 2020/0258897 A1 | 8/2020 | Yan et al. | |
| 2020/0328223 A1 | 10/2020 | Lai et al. | |
| 2020/0350234 A1 | 11/2020 | Shan et al. | |
| 2020/0350324 A1 | 11/2020 | Hoffman | |
| 2020/0357453 A1 | 11/2020 | Slesazeck et al. | |
| 2020/0357455 A1 | 11/2020 | Noack et al. | |
| 2020/0357470 A1 | 11/2020 | Noack | |
| 2020/0357822 A1 | 11/2020 | Chen | |
| 2020/0365609 A1 | 11/2020 | Harari | |
| 2020/0381450 A1 | 12/2020 | Lue et al. | |
| 2020/0388313 A1 | 12/2020 | Cho et al. | |
| 2020/0388711 A1 | 12/2020 | Doyle et al. | |
| 2020/0403002 A1 | 12/2020 | Harari | |
| 2020/0411533 A1 | 12/2020 | Alsmeier et al. | |
| 2021/0005238 A1 | 1/2021 | Mueller | |
| 2021/0013224 A1 | 1/2021 | Purayath et al. | |
| 2021/0020659 A1 | 1/2021 | Chen | |
| 2021/0066502 A1 | 3/2021 | Karda et al. | |
| 2021/0074725 A1 | 3/2021 | Lue | |
| 2021/0074726 A1 | 3/2021 | Lue | |
| 2021/0111179 A1 | 4/2021 | Shivaraman et al. | |
| 2021/0175251 A1 | 6/2021 | Zhang et al. | |
| 2021/0247910 A1 | 8/2021 | Kim et al. | |
| 2021/0248094 A1 | 8/2021 | Norman et al. | |
| 2021/0265308 A1 | 8/2021 | Norman et al. | |
| 2021/0375919 A1 | 12/2021 | Wang et al. | |
| 2021/0375933 A1 | 12/2021 | Lu et al. | |
| 2021/0375938 A1* | 12/2021 | Lin | H10D 30/701 |
| 2021/0407600 A1 | 12/2021 | Cariello | |
| 2021/0407845 A1 | 12/2021 | Wang et al. | |
| 2022/0020774 A1* | 1/2022 | Chia | H10B 51/20 |
| 2022/0028876 A1 | 1/2022 | Purayath et al. | |
| 2022/0028886 A1 | 1/2022 | Pur et al. | |
| 2022/0084564 A1 | 3/2022 | Choi et al. | |
| 2022/0139933 A1 | 5/2022 | Noack | |
| 2022/0231049 A1 | 7/2022 | Lin et al. | |
| 2022/0246766 A1 | 8/2022 | Manfrini et al. | |
| 2022/0254390 A1 | 8/2022 | Gans et al. | |
| 2022/0293788 A1* | 9/2022 | Lin | H10D 30/63 |
| 2022/0351776 A1 | 11/2022 | Nam et al. | |
| 2022/0384459 A1 | 12/2022 | Lu et al. | |
| 2022/0393031 A1 | 12/2022 | Ando et al. | |
| 2023/0052477 A1 | 2/2023 | Ha et al. | |
| 2023/0225130 A1* | 7/2023 | Liou | H10D 64/689<br>257/295 |

FOREIGN PATENT DOCUMENTS

| | | |
|---|---|---|
| JP | 2004079606 A | 3/2004 |
| JP | 2006099827 A1 | 4/2006 |
| JP | 2009206451 A1 | 9/2009 |
| JP | 2010108522 A1 | 5/2010 |
| JP | 2010251572 A | 11/2010 |
| JP | 2011028540 A1 | 2/2011 |
| KR | 20120085591 A1 | 8/2012 |
| KR | 20120085603 A | 8/2012 |
| WO | 2018236937 A1 | 12/2018 |
| WO | 2019066948 A1 | 4/2019 |
| WO | 2019152226 A1 | 8/2019 |

OTHER PUBLICATIONS

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Kunitake, Hitoshi , et al., "High-temperature Electrical Characteristics of 60nm CAAC-IGZO FET : Comparison with Si FET", International Conference on Solid State Devices and Materials, https://doi.org/10.7567/SSDM.2018.N-3-04, Sep. 2018, pp. 787-788.

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young , et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J. , et al., "Characterization of Fatigue and Its Recovery Behavior in Ferroelectric HfZrO", 2021 Symposium on VLSI Technology, Jun. 2021, 2 p.

Ciao, C.Y. , et al., "Multibit Ferroelectric FET Based on Nonidentical Double HfZrO2 for High-Density Nonvolatile Memory", IEEE Electron Device Letters, vol. 42, No. 4, doi: 10.1109/LED.2021.3060589., Apr. 2021, pp. 617-620.

Lue, H.T. , et al., "A Highly Scalable 8-Layer 3D Vertical-gate {Vg) TFT NANO Flash Using Junction-Free Buried Channel BE-SONOS Device", Symposium on VLSI: Tech. Dig. Of Technical Papers, 2010, pp. 131-132.

Materano, Monica , et al., "Interplay between oxygen defects and dopants: effect on structure and performance of HfO2-based ferroelectrics", Inorg. Chem. Front. (8), Apr. 9, 2021, pp. 2650-2672.

Mcbriarty, Martin E., et al., "Crystal Phase Distribution and Ferroelectricity in Ultrathin HfO2—ZrO2 Bilayers", Phys. Status Solidi B, 257: 1900285. https://doi.org/10.1002/pssb.201900285, Aug. 21, 2019, pp. 1-25.

Mittmann, T. , et al., "Impact of Oxygen Vacancy Content in Ferroelectric HZO films on the Device Performance", 2020 IEEE International Electron Devices Meeting (IEDM), doi: 10.1109/IEDM13553.2020.9372097., 2020, pp. 18.4.1-18.4.4.

Mo, Fei , et al., "Experimental Demonstration of Ferroelectric HfO2 FET with Ultrathin-body IGZO for High-Density and Low-Power Memory Application", 2019 Symposium on VLSI Technology, 3, doi: 10.23919/VLSIT.2019.8776553., 2019, pp. T42-T4 Jul. 13, 2020, 7 pages.

Wang, Chin-I , et al., "Atomic layer deposited TiN capping layer for sub-10 nm ferroelectric Hf0.5Zr0.5O2 with large remnant polarization and low thermal budget", Applied Surface Science, vol. 570, 2021, 151152, ISSN 0169-4332, https://doi.org/10.1016/j.apsusc.2021.151152., Aug. 9, 2021, pp. 1-8.

Mo, Fei , et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S. , et al., "Development Status of Gate-First FeFET Technology", 2021 Symposium on VLSI Technology, Jun. 2021, 2 pages.

Mueller, J. , et al., "Ferroelectric Hafnium Oxide Based Materials and Devices: Assessment of Current Status and Future Prospects", ECS Journal of Solid State Science and Technology, 4 (5) N30-N35 (2015), Feb. 21, 2015, pp. N29-N35.

Mueller, J. , et al., "Ferroelectric hafnium oxide: A CMOS-compatible and highly scalable approach to future ferroelectric

(56) References Cited

OTHER PUBLICATIONS memories", IEEE International Electron Devices Meeting, Washington, DC, USA, doi: 10.1109/EDM.2013.6724605., 2013, pp. 10.8.1-10.8.4.
Mueller, Stephen , et al., "From MFM Capacitors Toward Ferroelectric Transistors: Endurance and Disturb Characteristics of HfO2-Based FeFET Devices", IEEE Transactions on Electron Devices, vol. 60, No. 12, doi: 10.1109/TED.2013.2283465., Dec. 2013, pp. 4199-4205.
Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.
Nguyen, Manh-Cuong , et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.
On, Nuri , et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.
Onaya, Takashi , et al., "Improvement in ferroelectricity of HfxZr1-xO2 thin films using top- and bottom-ZrO2 nucleation layers", APL Materials 7, 061107; https://doi.org/10.1063/1.5096626, 2019, pp. 1-8.
Onuki, Tatsuya , et al., "Embedded memory and ARM Cortex-M0 core using 60-nm C-axis aligned crystalline indium-gallium-zinc oxide FET integrated with 65-nm Si CMOS", IEEE Journal of Solid-State Circuits, vol. 52, No. 4,, Apr. 2017, pp. 925-932.
Park, Goon-Ho , et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.
Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.
Rios, Rafael , et al., "A Physically Based Compact Model for IGZO Transistors", IEEE Transactions on Electron Devices, vol. 68, No. 4, doi: 10.1109/TED.2021.3059387., Apr. 2021, pp. 1664-1669.
Rzehak, Volker , "Low-Power FRAM Microcontrollers and Their Applications", Texas Instruments White Paper, SLAA502, Jul. 2019, 7 pages.
Saitoh, Masumi , et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.
Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.
Salahuddin, Sayeef , et al., "FeFETs for Near-Memory and In-Memory Compute", 2021 IEEE International Electron Devices Meeting (IEDM), Department of Electrical Engineering and Computer Sciences, Dec. 2021, 4 pages.
Sato, Yuta , et al., "Source/Drain Contact Engineering of InGaZnO Channel BEOL Transistor for Low Contact Resistance and Suppressing Channel Shortening Effect,", 20th International Workshop on Junction Technology (IWJT), doi: 10.23919/IWJT52818.2021.9609366., 2021, 3 pages.
Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.
Sheng, Jiazhen , et al., "Review Article: Atomic layer deposition for oxide semiconductor thin film transistors: Advances in research and development", J. Vac. Sci. Technol. A 36, 060801, https://doi.org/10.1116/1.5047237., Nov. 2, 2018, 14 pages.
Yang, Jin , et al., "Highly Optimized Complementary Inverters Based on p-SnO and n-InGaZnO With High Uniformity", IEEE Electron Device Letters, vol. 39, No. 4, doi: 10.1109/LED.2018.2809796., Apr. 2018, pp. 516-519.
Si, Mengwei , et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.
Su, Nai-Chao , et al., "A Nonvolatile InGaZnO Charge-Trapping-Engineered Flash Memory With Good Retention Characteristics", IEEE Electron Device Letters, vol. 31, No. 3, Mar. 2010, pp. 201-203.
Sun, Chen , "First Demonstration of BEOL-Compatible Ferroelectric TCAM Featuring a-IGZO Fe-TFTs with Large Memory Window of 2.9 V, Scaled Channel Length of 40 nm, and High Endurance of 10/\Cycles", 2021 Symposium on VLSI Technology Digest of Technical Papers, Kyoto, doi: 978-4-86348-779-6., Jun. 2021, 2 pages.
Tan, Ava J., et al., "A Nitrided Interfacial Oxide for Interface State Improvement in Hafnium Zirconium Oxide-Based Ferroelectric Transistor Technology", IEEE Electron Device Letters, vol. 39, No. 1, doi: 10.1109/LED.2017.2772791., Jan. 2018, pp. 95-98.
Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.
Tan, Ava Jiang, et al., "Ferroelectric HfO2 Memory Transistors with High-κ Interfacial Layer and Write Endurance Exceeding 1010 Cycles", arXiv:2103.08806 [physics.app-ph], available at https://arxiv.org/abs/2103.08806., Mar. 16, 2021.
Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.
Tan, Yan-Ny , et al., "Over-Erase Phenomenon in SONOS-Type Flash Memory and its Minimization Using a Hafnium Oxide Charge Storage Layer", IEEE Transactions on Electron Devices, vol. 51, No. 7, Jul. 2004, pp. 1143-1147.
Tanaka, T. , et al., "A 768 GB 3b/cell 3D-Floaling-Gate NANO Flash Memory", Digest of Technical Papers, the 2016 EEE International Solid-Slate Circuits Conference, 2016, pp. 142-144.
Van Houdt, Jan , "The 3D FeFET: contender for 3D-NAND Flash memory and machine learning", available at https://www.imec-int.com/en/imec-magazine/imec-magazine-october-2017/the-vertical-ferroelectric-fet-a-new-contender-for-3d-nand-flash-memory-and-machine-learning, Sep. 30, 2019, 8 pages.
"EP Extended Search Report EP168690149.3", Oct. 18, 2019.
"European Search Report, EP 16852238.1", Mar. 28, 2019.
"European Search Report, EP17844550.8", Aug. 12, 2020, 11 pages.
"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.
"Invitation to Pay Additional Fees (PCT/ISA/206), PCT/US2020/015710", Mar. 20, 2020, 2 pages.
"Invitation to Pay Additional Fees, PCT/US2019/065256", Feb. 13, 2020, 2 pages.
"Notification of Reasons for Refusal, Japanese Patent Application 2018-527740", (English translation), Nov. 4, 2020, 8 pages.
"Partial European Search Report EP 16869049.3", Jul. 1, 2019, pp. 1-12.
"PCT Search Report and Written Opinion, PCT/US2018/038373", Sep. 10, 2018.
"PCT Search Report and Written Opinion, PCT/US2018/067338", May 8, 2019.
"PCT Search Report and Written Opinion, PCT/US2019/014319", Apr. 15, 2019.
"PCT Search Report and Written Opinion, PCT/US2019/041678", Oct. 9, 2019.
"PCT Search Report and Written Opinion, PCT/US2019/052164", Feb. 27, 2020.

(56) References Cited

OTHER PUBLICATIONS

"PCT Search Report and Written Opinion, PCT/US2019/052446", Dec. 11, 2019.
"PCT Search Report and Written Opinion, PCT/US2019/065256", Apr. 14, 2020.
"PCT Search Report and Written Opinion, PCT/US2020/015710", Jun. 9, 2020.
"PCT Search Report and Written Opinion, PCT/US2020/017494", Jul. 20, 2020, 13 pages.
"PCT Search Report and Written Opinion, PCT/US2020/065374", Mar. 15, 2021, 17 pages.
"PCT Search Report and Written Opinion, PCT/US2020/065670", Apr. 5, 2021, 12 pages.
"PCT Search Report and Written Opinion, PCT/US2021/016964", Jun. 15, 2021, 19 pages.
"PCT Search Report and Written Opinion, PCT/US2021/025722", Jun. 15, 2021, 10 pages.
"PCT Search Report and Written Opinion, PCT/US2021/042607", Nov. 4, 2021, 17 pages.
"PCT Search Report and Written Opinion, PCT/US2021/064844", Mar. 8, 2022, 15 paged.
"PCT Search Report and Written Opinion, PCT/US2021/42620", Oct. 28, 2021, 18 pages.
"PCT Search Report and Written Opinion, PCT/US2022/016729", Applicant: SunRise Memory Corporation, May 17, 2022, 20 pages.
"PCT Search Report and Written Opinion, PCT/US2022/039473", Dec. 6, 2022, 14 pages.
Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.
Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.
Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/IEDM19573.2019.8993642., Dec. 2019, pp. 28.7.1-28.7.4.
Ali, T. , et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.
Bae, Jong-Ho , et al., "Highly Scaled, High Endurance, Ω-Gate, Nanowire Ferroelectric FET Memory Transistors", IEEE Electron Device Letters, vol. 41, No. 11, doi: 10.1109/LED.2020.3028339.—Sayeef-Berkeley paper on FeFET memory, Nov. 2020, pp. 1637-1640.
Beyer, Sven , et al., "FeFET: A versatile CMOS compatible device with game-changing potential", IEEE International Memory Workshop (IMW), doi: 10.1109/IMW48823.2020.9108150., 2020, pp. 1-4.
Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.
Chan, Chi-Yu , et al., "FeFET Memory Featuring Large Memory Window and Robust Endurance of Long-Pulse Cycling by Interface Engineering using High-k AION", 2020 IEEE Symposium on VLSI Technology, doi: 10.1109/VLSITechnology18217.2020.9265103., 2020, pp. 1-2.
Chang, Sou-Chi , et al., "Anti-ferroelectric HfxZr1-xO2 Capacitors for High-density 3-D Embedded-DRAM", IEEE International Electron Devices Meeting (IEDM), doi: 10.1109/IEDM13553.2020.9372011., 2020, pp. 28.1.1-28.1.4.
Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.
Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.
Choi, Seonjun , et al., "A novel three-dimensional NAND flash structure for improving the erase performance", IEICE Electronics Express, 2019 vol. 16 Issue 3, 2019, 6 pages.
De, Sourav , et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.
Dünkel , "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.
Dutta, Sourav , et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.
Florent, K. , "First demonstration of vertically stacked ferroelectric Al doped HfO2 devices for NAND applications", Symposium on VLSI Technology, doi: 10.23919/VLSIT.2017.7998162., 2017, pp. T158-T159.
Florent, K. , et al., "Vertical Ferroelectric HfO2 FET based on 3-D Nand Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.
Hendy, Ian , "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Hsain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.
Jeewandara, Thamarasee , et al., "High-speed 3-D memory with ferroelectric NAND flash memory", available at https://techxplore.com/news/2021-01-high-speed-d-memoryferroelectric-nand.html, Jan. 26, 2021, 5 pages.
Kawai, H. , et al., "Design Principle of Channel Material for Oxide Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.
Kim, Min-Kyu , et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.
Kim, Taeho , et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.

* cited by examiner

MEMORY DEVICE AND METHOD FOR MANUFACTURING THEREFOR

CROSS REFERENCE TO RELATED APPLICATIONS

This application claims the benefits of Japanese Patent Application No. 2022-079389 filed in Japan on May 13, 2022, which is incorporated herein by reference for all purposes.

FIELD OF THE INVENTION

The present invention relates to memory or storage devices and their manufacturing methods. In particular, the present invention relates to memory or storage devices, including those formed in a three-dimensional memory or storage array out of thin-film memory or storage transistors, whether based on any charge-storage and ferroelectric mechanisms.

BACKGROUND OF THE INVENTION

In recent years, to achieve high integration of semiconductor storage devices, multilayer storage devices in which memory or storage cells are integrated three-dimensionally have been developed. In a three-dimensional memory or storage device, high reliability of operation is required.

SUMMARY

According to one embodiment of the present invention, a memory device includes a stacked body of conductor-including layers and insulating films that are alternately provided one atop another along the first direction. Formed in the stacked body are pillar bodies, each pillar body including first and second conductive pillars (e.g., semiconductor pillars of a first conductivity type) isolated from each other by an insulator pillar. Within the stacked body, each conductor-including layer includes a semiconductor member in contact with the first and second conductive pillars, an electrode film and a ferroelectric layer between the semiconductor member and the electrode film. The semiconductor members in the conductor-including layers are separated from each other in the first direction.

According to one embodiment of the present invention, a method for forming a memory device includes: making a stacked body of alternately provided sacrificial and insulating films, one atop another along a first direction; forming a through-hole in the stack, the through-hole extends along the first direction; forming recesses into the sacrificial films at a side surface of the through-hole; forming a semiconductor layer of the second conductivity type on the side surface of the through-hole; anisotropically etching the semiconductor layer from the side surface of the through-hole, such that only portions of the semiconductor layer located in the recesses remain and forming semiconductor members; forming pillar bodies each including first and second conductive pillars (e.g., depositing semiconductor material of the first conductivity type) and an insulator pillar between the first and the second conductive pillars, the pillars each extending along the first direction in the through-hole; removing the sacrificial films to form cavities bordered by exposed surfaces of the semiconductor members and the insulating films; forming a ferroelectric layer over exposed surfaces of the semiconductor members in the cavities and the insulating films; and forming a conductor in each of the cavities.

Therefore, a memory or storage device capable of highly reliable operations and a method for manufacturing such a memory or storage device are realized.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 5A shows a region corresponding to region C of FIG. 2; and FIG. 5B shows a region corresponding to region D of FIG. 3;

DETAILED DESCRIPTION OF THE INVENTION

Figure 1:
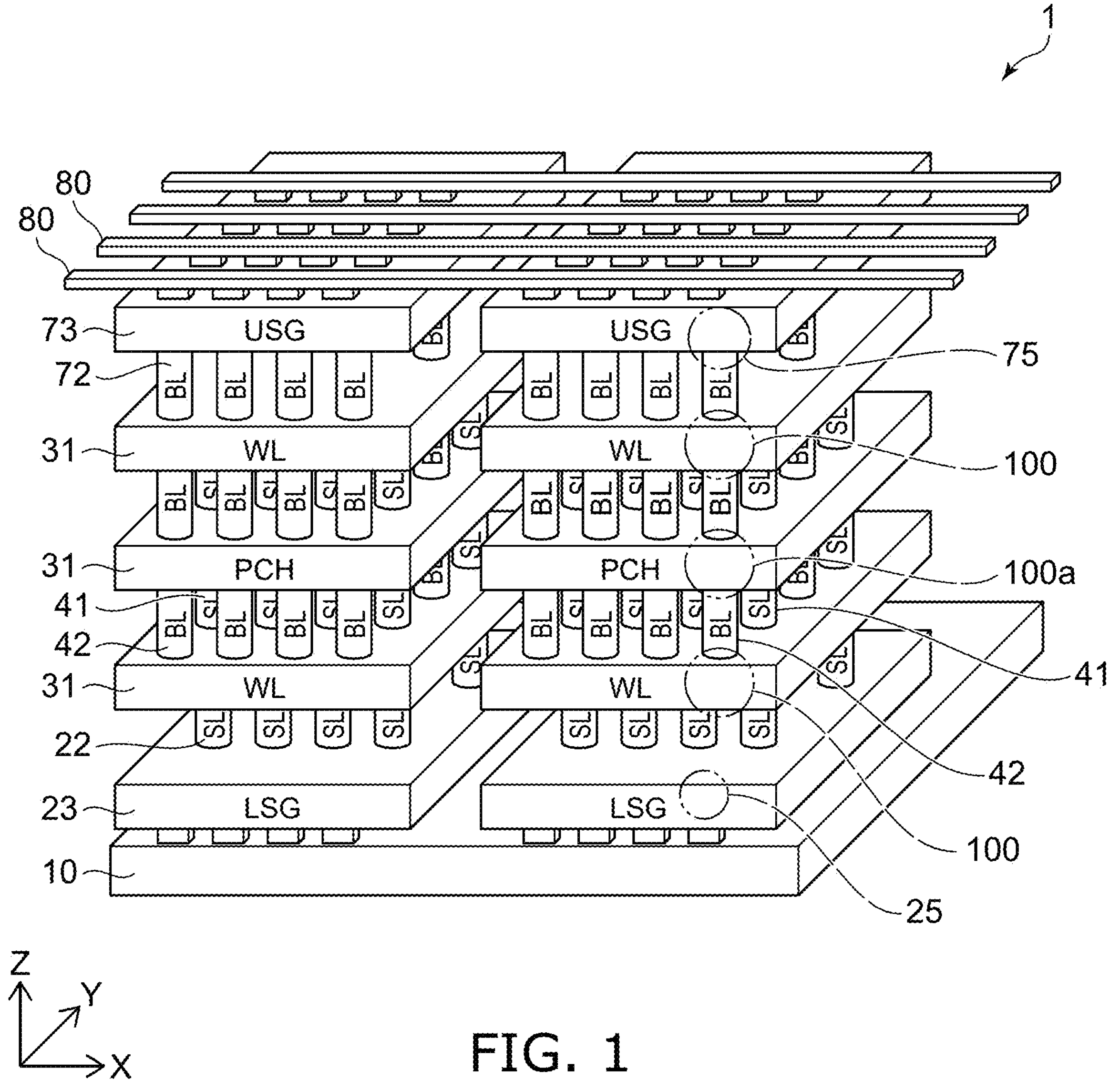
FIG. 1 is a perspective view showing semiconductor memory device 1, according to a first embodiment of the present invention.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures. Moreover, the drawings provided herein are idealized representations to illustrate embodiments of the present disclosure and are not meant to be actual views of any particular component, structure, or device. The drawings are not necessarily to scale, and the thickness and dimensions of some layers may be exaggerated for effective presentation. Variations from the shapes of the illustrations are to be expected. For example, a region illustrated as a box shape may typically have rough and/or nonlinear features. Sharp angles that are illustrated may be rounded. Like numerals refer to like components throughout.

In this detailed description, many features (e.g., "pillar bodies 40") are present in one or more embodiments in pluralities. In some instances, the feature may be discussed collectively (e.g., as "pillar bodies 40"). Elsewhere, an individual representative instance of the same feature may be discussed. In those instances, the representative instance of the feature is presented in singular and called out by the same reference numeral (e.g., as "pillar body 40"). Unless expressly specified, the discussion of the representative instance of the feature in singular is applicable to all instances of the same feature.

First Embodiment

FIGS. 1-6 illustrate semiconductor memory device 1, according to one embodiment of the present invention. In FIG. 1, only conductive portions of semiconductor memory device 1 are shown, with insulating portions omitted. The semiconductor memory device is sometimes referred to as a storage device. As shown in FIG. 1, semiconductor memory device 1 includes source pillars 41 (each labeled "SL") and drain pillars 42 (each labeled "BL"), which are provided adjacent multiple electrode films 31, which serve as (i) gate electrodes (each labeled "WL") for memory cell transistors 100, (ii) gate electrodes [**100*a*] (each labeled "PCH") for pre-charge transistors 100*a*, and (iii) lower select gate electrode films 23 and upper select gate electrode films 73. The lower select gate electrode films 23 are each labeled "LSG" and the upper select gate electrode films 73** are each labeled "USG".

As shown in FIGS., 1-4, semiconductor memory device 1 is formed on substrate 10 and is organized as a lower structure 20, a stacked body 30, pillar or columnar bodies 40, semiconductor members 50, ferroelectric layers 60, a upper structure 70, bit lines 80, and ST structures 90. ST structures 90 separate memory device 1 into portions 34 each including lower structure 20, stacked body 30 and upper structure 70. See, e.g., FIGS. 3-4. Stacked body 30 includes electrode films 31 and inter-electrode insulating films 32. Pillar bodies 40 are provided within stacked body 30, each pillar body including one instance of source pillars 41 and one instance of drain pillars 42, electrically isolated from each other by one instance of insulator pillars 43.

In FIGS. 1-5, the direction from substrate 10 toward stacked body 30 is taken as the "Z-direction". In each of pillar bodies 40, the direction from source pillar 41 toward drain pillar 42 is taken as the "Y-direction". The direction orthogonal to the Z-direction and the Y-direction is taken as the "X-direction". Along the Z-direction, the direction that is from substrate 10 toward stacked body 30 may be referred to in this detailed description as "up", while the opposite direction may be referred to as "down." For example, in semiconductor memory device 1, substrate 10, lower structure 20, stacked body 30, upper structure 70, and bit lines 80 are arranged in this order upward from below. Likewise, an item located upwards from a second item may be described as being "above" the second item, and the second item may be described as being "below" the first item. Note that the Z direction does not necessarily represent the direction of Earth's gravity.

Substrate 10 may be formed using single-crystal silicon (Si). An upper layer portion of substrate 10 may be rendered conductive by being doping with an impurity. Lower structure 20 may include insulating film 21, lower semiconductor pillars 22, lower select gate electrode film 23, and lower select gate insulating films 24.

Insulating film 21 may be formed out of silicon oxide ($SiO_2$). Lower semiconductor pillars 22—which are embedded in insulating film 21—each extend lengthwise along the Z direction. Lower semiconductor pillar 22 may be formed out of a semiconductor material or a conductive material and is sometimes referred to as a conductive pillar 22. Lower semiconductor pillar 22 has a lower end connected to substrate 10. In this detailed description, the term "connected" refers to an electrical connection. Lower select gate electrode film 23—which spreads over an X-Y plane—is conductive. Lower select gate insulating film 24, which is located at the periphery of each of lower semiconductor pillars 22, is interposed between lower semiconductor pillars 22 and lower select gate electrode film 23.

Stacked body 30 is located above lower structure 20. In the semiconductor memory device 1 thus formed, conductor-including layers, each including an electrode film 31, and inter-electrode insulating films 32 are alternately formed along the Z-direction. Electrode films 31 includes a conductive material (e.g., formed out of doped polysilicon or a metal material, such as tungsten (W)). Inter-electrode insulating films 32 may be formed out of, for example, silicon oxide. In the present description, a conductor-including layer refers to the layers in the stacked body formed between adjacent inter-electrode insulating films 32. Each conductor-including layer includes an electrode film 31, the ferroelectric layer 60 and the semiconductor member 50.

Through-holes 33—each extending lengthwise through stacked body 30 along the Z-direction—are provided, with through-holes 33 each accommodating one of pillar bodies 40. See, e.g., FIGS. 2-4 and 5A-5B. Through-hole 33—and hence pillar body 40—is columnar or cylindrical and having, for example, an elliptical cross-section in an X-Y plane, with a major-axis along the Y-direction and a minor axis along X-direction. Of course, pillar body 40 may have any suitable shape in an X-Y plane (e.g., circular, rectangular or other suitable shapes). In this detailed description, the terms "ellipse" and "elliptical" may also include ovals, for example, in addition to a mathematically exact ellipse. Each of pillar bodies 40 may have the same X-Y plane cross-section along the Z-direction, or may taper downwards, for example.

In pillar body 40, source pillar 41 and drain pillar 42 are separated and electrically isolated from each other along the Y-direction by insulator pillar 43. See, e.g., FIGS. 5A-5B. The lower end of each source pillar 41 is connected to the upper end of a corresponding lower semiconductor pillar 22. Accordingly, source pillar 41 is connected to substrate 10 via a corresponding lower semiconductor pillar 22.

Within pillar body 40, interface 47—where source pillar 41 meets insulator pillar 43, for example—may be planar in an X-Z plane. Likewise, interface 48—where drain pillar 42 meets insulator pillar 43, for example—may also be planar in an X-Z plane. Accordingly, interface 47 and interface 48 within each of pillar bodies 40 may be seen in an X-Y plane cross-section as two mutually parallel straight lines extending in the X-direction.

Source pillars 41 and drain pillars 42 may each be formed out of a conductive material (e.g., n-type doped silicon). Alternatively, source pillars 41 and drain pillars 42 may be made of a low resistivity material or a metallic material (e.g., titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers). Insulator pillars 43 may each be formed out of a single insulating material (e.g., any of: silicon oxide, silicon nitride (SiN), or any low-k material). In some embodiments, pillar body 40 need include only a source pillar 41, a drain pillar 42, and an insulator pillar 43. In the present embodiment, source pillars 41 and drain pillars 42 are sometimes referred to as semiconductor pillars or conductive pillars, referring to pillars with semiconductor materials of a given conductivity type or pillars with low resistivity materials, such as a metal.

Semiconductor member 50 is provided between pillar body 40 and electrode film 31. Semiconductor member 50 has an annular, ring or arc shape, for example, and contacts both source pillar 41 and drain pillar 42 at each pillar body 40. See, e.g., FIG. 5A. The annular or ring shape need not be a closed loop (e.g., can be merely an arc), and may be an elliptical ring, an oval ring, a circular ring, or a rectangular or other polygonal frame that conform to pillar body 40. Semiconductor members 50 (e.g., the same number as the number of electrode films 31) are provided along the peripheries of pillar bodies 40 and are separated from each other along the Z-direction.

Semiconductor members 50 may include a semiconductor material (e.g., p-type silicon or an oxide semiconductor material, such as n-type IGZO (InGaZnO), IWO (InWO), IGZTO (InGaZnSnO)). In some embodiments, semiconductor members 50 may be formed from other oxide semiconductor materials, such as indium zinc oxide (IZO), indium tungsten oxide (IWO), or indium tin oxide (ITO). A lower leakage current and/or a higher on-current may be expected when semiconductor members 50 are formed using an oxide semiconductor. Source pillar 41, drain pillar 42, and insulator pillar 43 of pillar body 40 contact alternately, along the Z-direction, semiconductor members 50 and inter-electrode insulating films 32. See, e.g., FIGS. 3-4.

Ferroelectric layer 60 is provided between electrode film 31 and semiconductor member 50, and may be provided adjacent a surface of electrode films 31. See, e.g., FIG. 5A. Ferroelectric layers 60 may be made of a ferroelectric material (e.g., hafnium zirconium oxide (HfZrO), hafnium silicon oxide (HfSiO), hafnium aluminum oxide (HfAlO), lead zirconate titanate (PZT)). In some embodiments, ferroelectric layer 60 may be a doped hafnium oxide layer. In some examples, the doped hafnium oxide layer may include one or more of: zirconium-doped hafnium oxide (HZO), silicon-doped hafnium oxide (HSO), aluminum zirconium-doped Hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO) and any hafnium oxide that includes zirconium impurities.

Interface insulating layer 61 may be provided between ferroelectric layer 60 and semiconductor member 50 and between ferroelectric layer 60 and inter-electrode insulating film 32. See, e.g., FIGS. 5A-5B. Interface insulating layer 61 may be formed of an insulating material (e.g., silicon oxide, silicon nitride (SiN), silicon oxynitride (SiON)). Interface insulating layer 61 is optional (i.e., need not be provided), as ferroelectric layer 60 is generally insulating. However, when semiconductor member 50 is made of silicon and the ferroelectric layer 60 is made of HfSiO, interface insulating layer 61 can reduce silicon diffusion from semiconductor member 50 into ferroelectric layer 60. Silicon diffusion may cause degradation of polarization performance in ferroelectric layer 60. On the other hand, when semiconductor member 50 is an oxide semiconductor, there is a lesser risk of diffusion of the oxide semiconductor material into ferroelectric layer 60. In that case, because interface insulating layer 61 is not present, the electric field can be more effectively applied to ferroelectric layer 60, and degradation due to a high electric field in interface insulating layer 61 is avoided.

Upper structure 70 is located above stacked body 30. See, e.g., FIGS. 3-4. Upper structure 70 includes insulating film 71, multiple upper semiconductor pillars 72, upper select gate electrode film 73, and upper select gate insulating films 74. Insulating film 71 may be made of silicon oxide. Upper semiconductor pillars 72 may be made of a semiconductor material or a conductive material and is sometimes referred to as a conductive pillar 72. Each upper semiconductor pillar 72 extends through insulating film 71 along the Z-direction to connect to an upper end of a respective drain pillar 42.

Upper select gate electrode film 73—which may be made of a conductive material—is provided in insulating film 71 and spreads over an X-Y plane. Upper select gate insulating film 74 is an insulating material that is provided at the periphery of upper semiconductor pillar 72, so as to interpose between upper semiconductor pillar 72 and upper select gate electrode film 73.

Bit lines 80, each extending along the X-direction, are located above upper structure 70 and at predetermined intervals along the Y-direction. The pitch of bit lines 80 (i.e., the separation between adjacent bit lines) along the Y-direction may be, for example, several tens of nanometers (nm). Bit lines 80 are each connected at one or more upper ends of upper semiconductor pillars 72, to connect thereby drain pillars 42. Bit lines 80 may be insulated by being encased in an insulating film (not shown) above upper structure 70.

Figure 2:
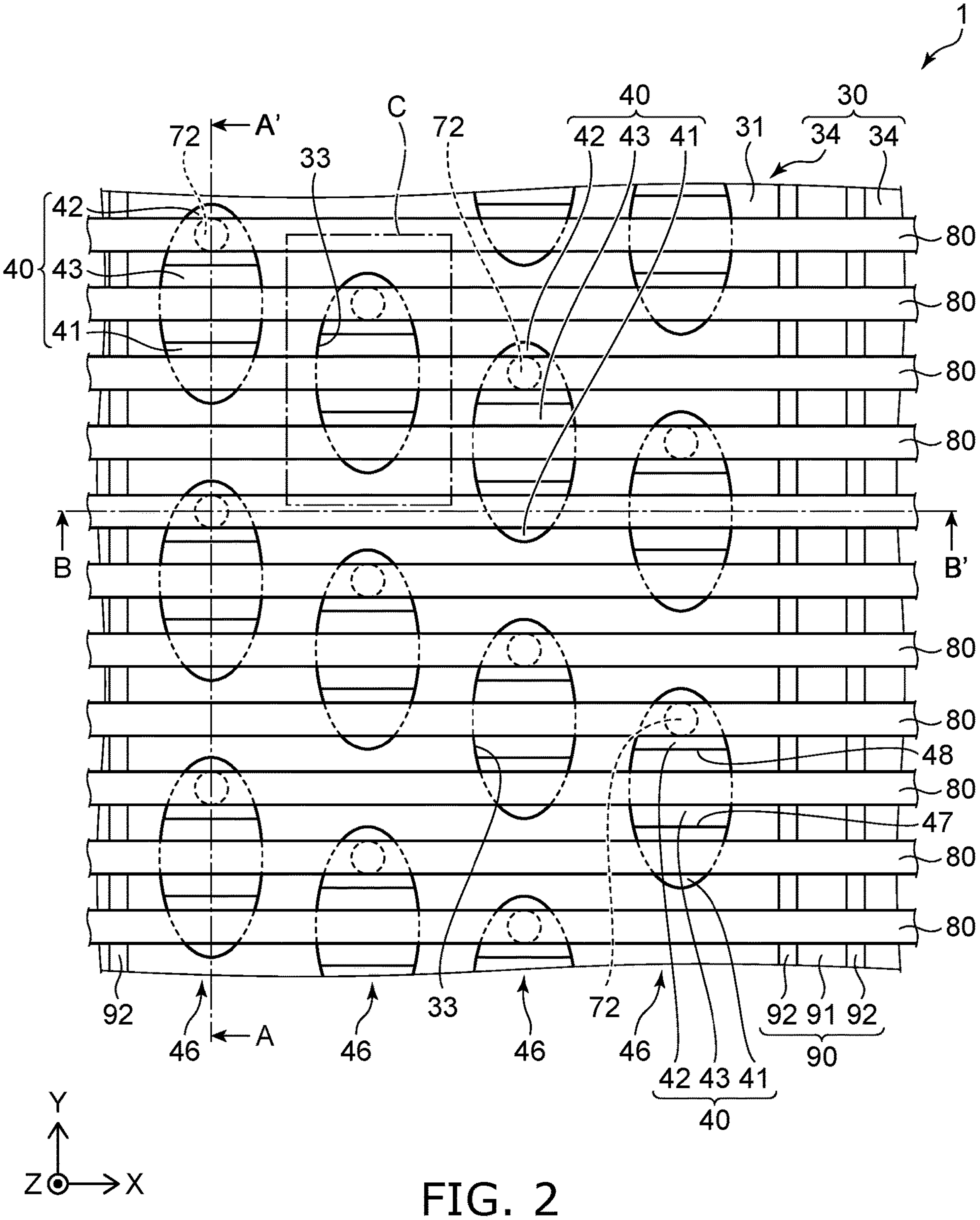
FIG. 2 is a plan view showing semiconductor memory device 1 of FIG. 1.
Figure 4:
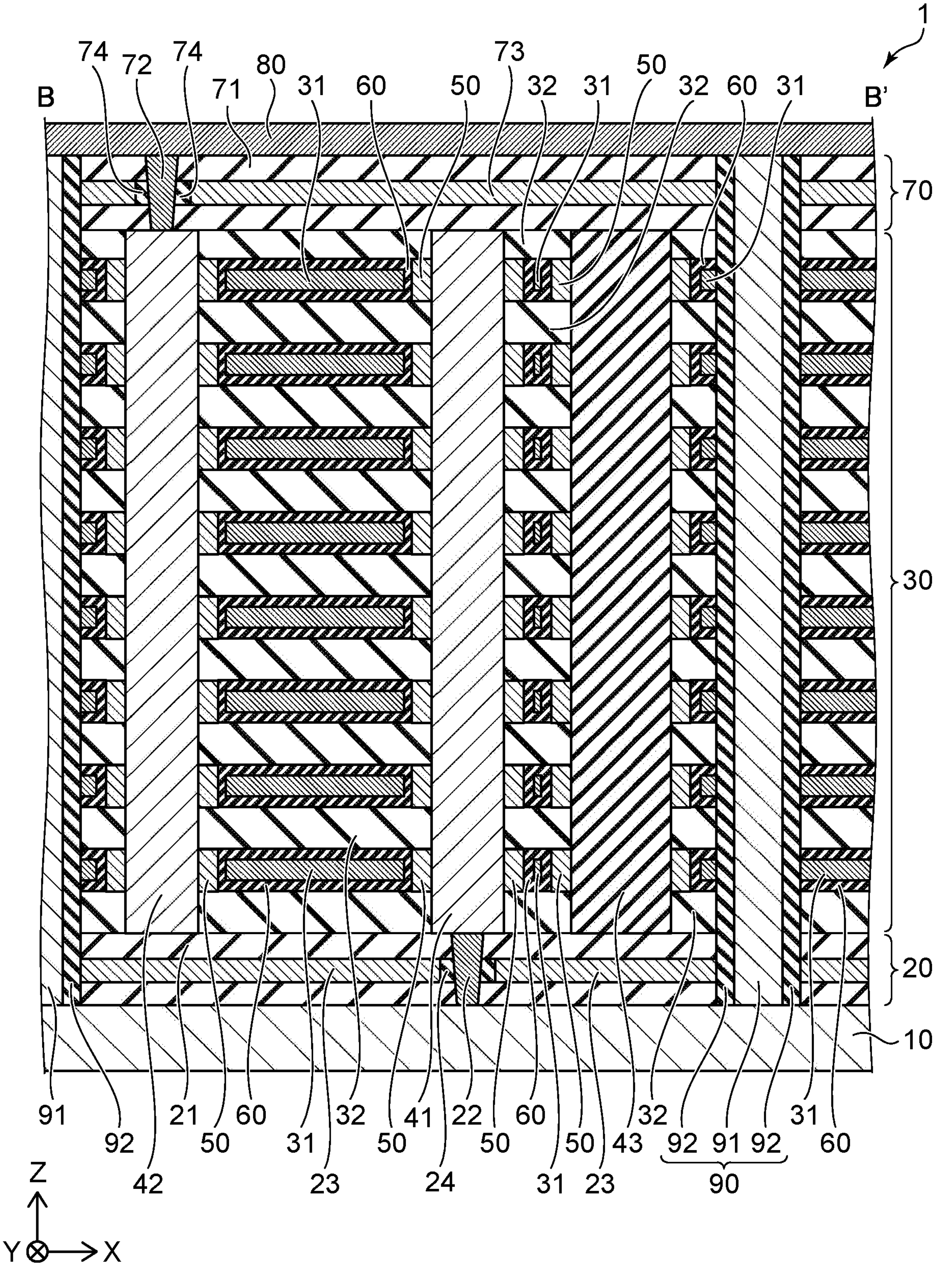
FIG. 4 is a cross-sectional view of semiconductor memory device 1 along line B-B' shown in FIG. 2.

In semiconductor memory device 1, multiple ST structures 90 are provided on substrate 10, in predetermined intervals along the X-direction. As shown in FIG. 4, ST structure 90 has a plate shape spreading over a Y-Z plane. In FIGS. 2 and 4, ST structure 90 divides semiconductor memory device 1 along the X-direction between two portions 34, with each portion 34 having both lower structure 20 and stacked body 30. ST structure 90 includes conductive plate 91 between two insulating plates 92, with each plate spreading over a Y-Z plane. Insulating plates 92 are each provided between conductive plate 91 and one of two stack portions 34 along an X-direction. Conductive plate 91 may be made of a conductive material (e.g., a metal or a doped polysilicon material). The lower end of conductive plate 91 is connected to substrate 10, thereby connecting conductive plate 91 to source pillars 41 and lower semiconductor pillars 22 (via substrate 10).

Portion 34 of stacked body 30, as demarcated by ST structure 90, includes multiple pillar bodies 40 arranged in columns (labeled columns 46 in FIG. 2). Pillar bodies 40 in adjacent columns are not aligned along the X-direction. That is, between columns 46, the pillar bodies 40 are offset in the Y-direction from each other. In fact, as shown in FIG. 2, none of pillar bodies 40 in columns 46 of a portion 34 are aligned in the X-direction, so that any bit line 80 that passes through the region directly above a portion 34 contacts and connects to only a single drain pillar 42 in a portion 34. In other words, drain pillars 42 of pillar bodies 40 in each portion 34 are each connected to a different one of bit lines 80.

Method for manufacturing a semiconductor memory device of the present invention

Figure 7A:
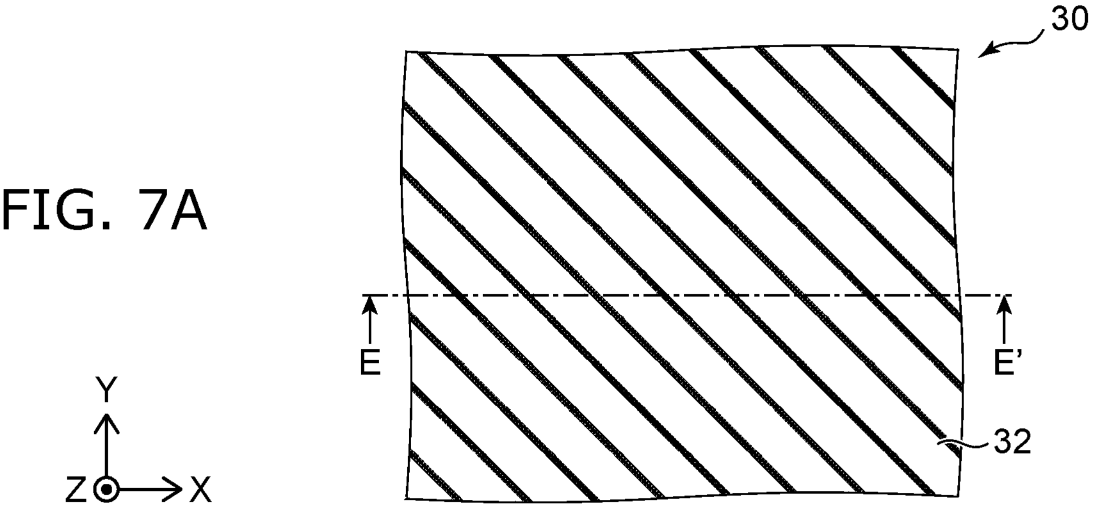
FIGS. 7A-7B, 8A-8B, 9A-9B, 10A-10B, 11A-11B, 12A-12C, 13A-13C, 14A-14C, 15A-15B, 16A-16B, 17A-17B, 18A-18B, 19A-19B, 20A-20B and 21A-21B are cross-sectional views illustrating a method for manufacturing semiconductor memory device 1 of FIG. 1.
Figure 7B:
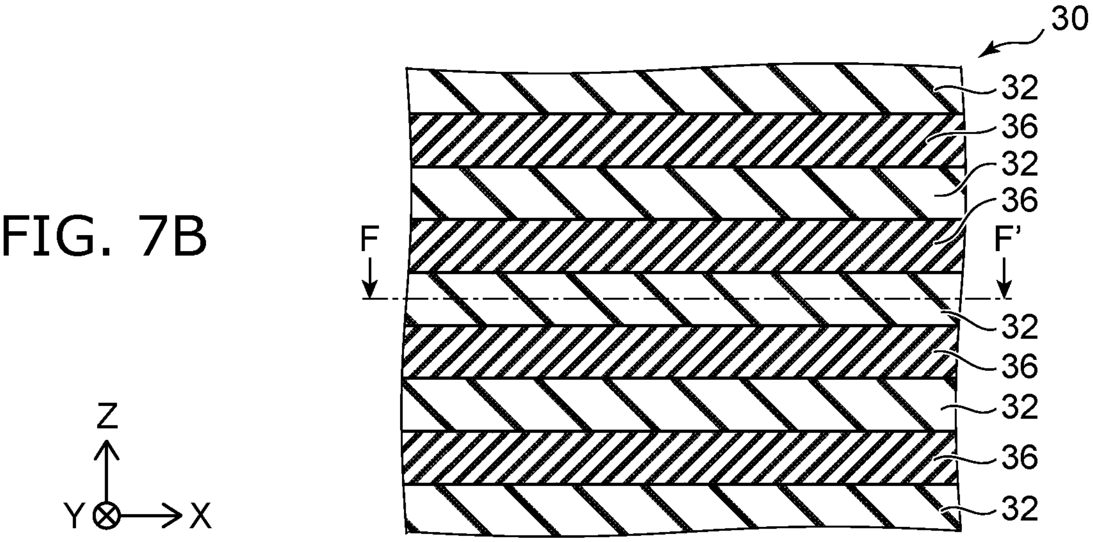

A method for manufacturing semiconductor memory device 1, according to one embodiment is now illustrated by FIGS. 7A-7B, 8A-8B, 9A-9B, 10A-10B, 11A-11B, 12A-12C, 13A-13C, 14A-14C, 15A-15B, 16A-16B, 17A-17B, 18A-18B, 19A-19B, 20A-20B and 21A-21B. More specifically, FIG. 7B is a cross-sectional view along line E-E' of the structure shown in FIG. 7A; and FIG. 7A is a plan view along line F-F' of the structure shown in FIG. 7B. Likewise for FIG. 8A and FIG. 8B, FIG. 9A and FIG. 9B, FIG. 10A and FIG. 10B, FIG. 11A and FIG. 11B, FIG. 15A and FIG. 15B, FIG. 16A and FIG. 16B, FIG. 17A and FIG. 17B, FIG. 18A and FIG. 18B, FIG. 19A and FIG. 19B, FIG. 20A and FIG. 20B, and FIG. 21A and FIG. 21B.

Figure 12A:
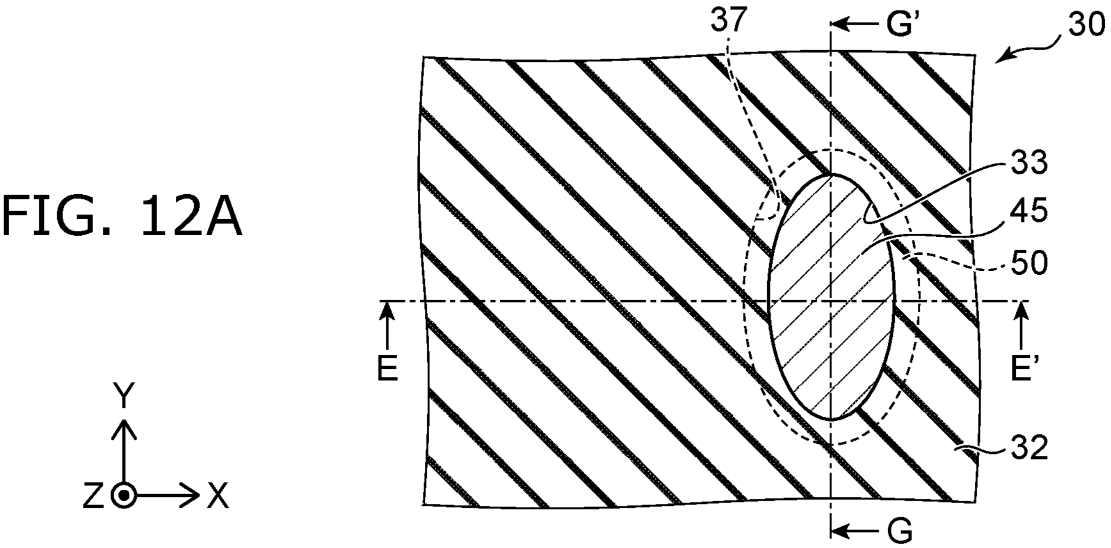
Figure 12B:
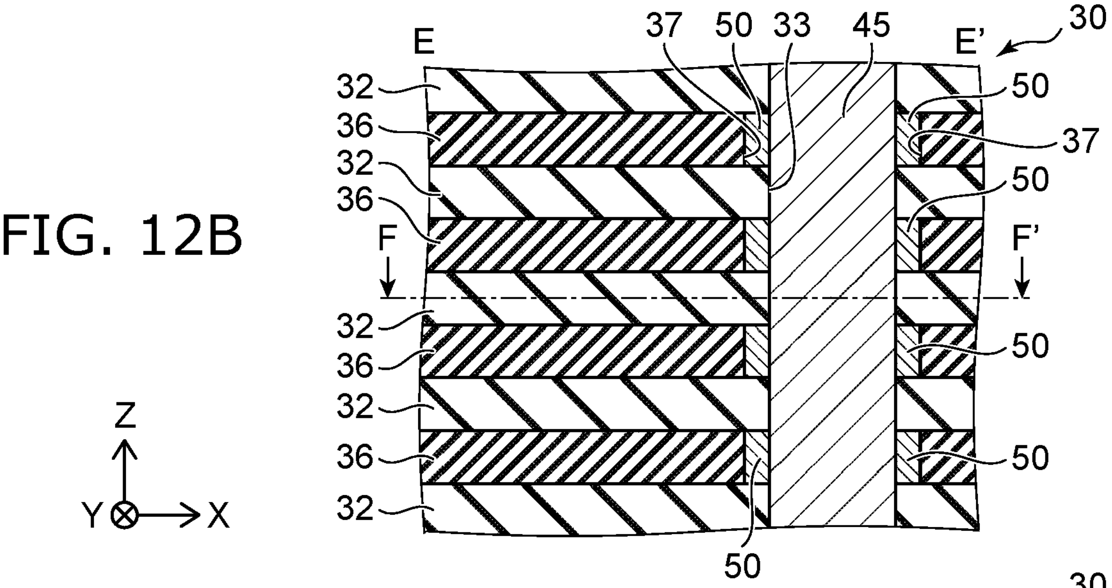
Figure 12C:
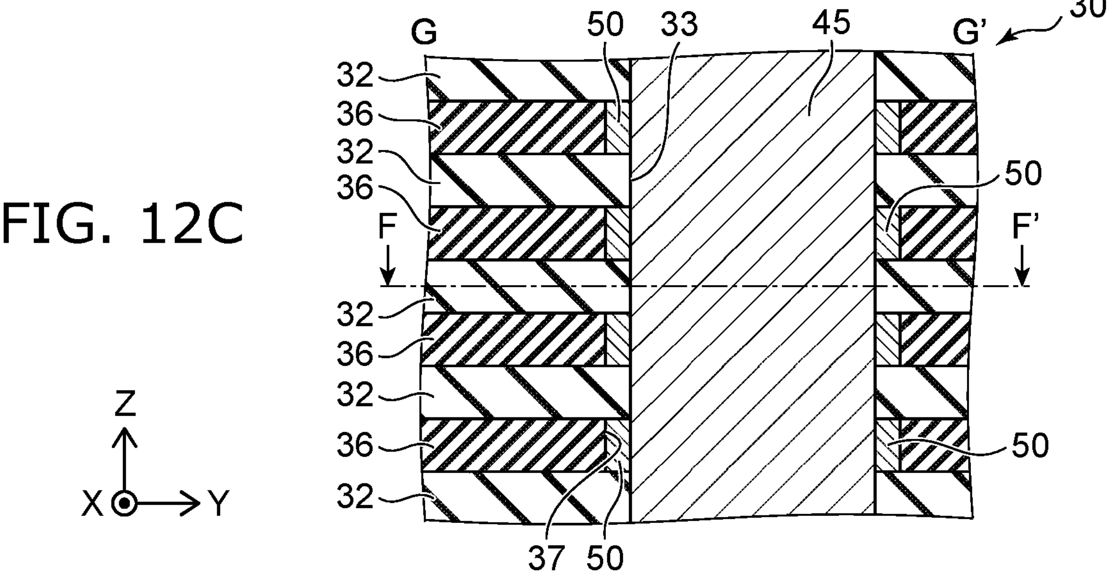

FIG. 12B is a cross-sectional view along line E-E' of the structure shown in FIG. 12A; FIG. 12C is a cross-sectional view along line G-G' of the structure shown in FIG. 12A; and FIG. 12A is a plan view along line F-F' of the structures shown in FIGS. 12B and 12C. Likewise for FIGS. 13A-13C and FIGS. 14A-14C.

Figure 3:
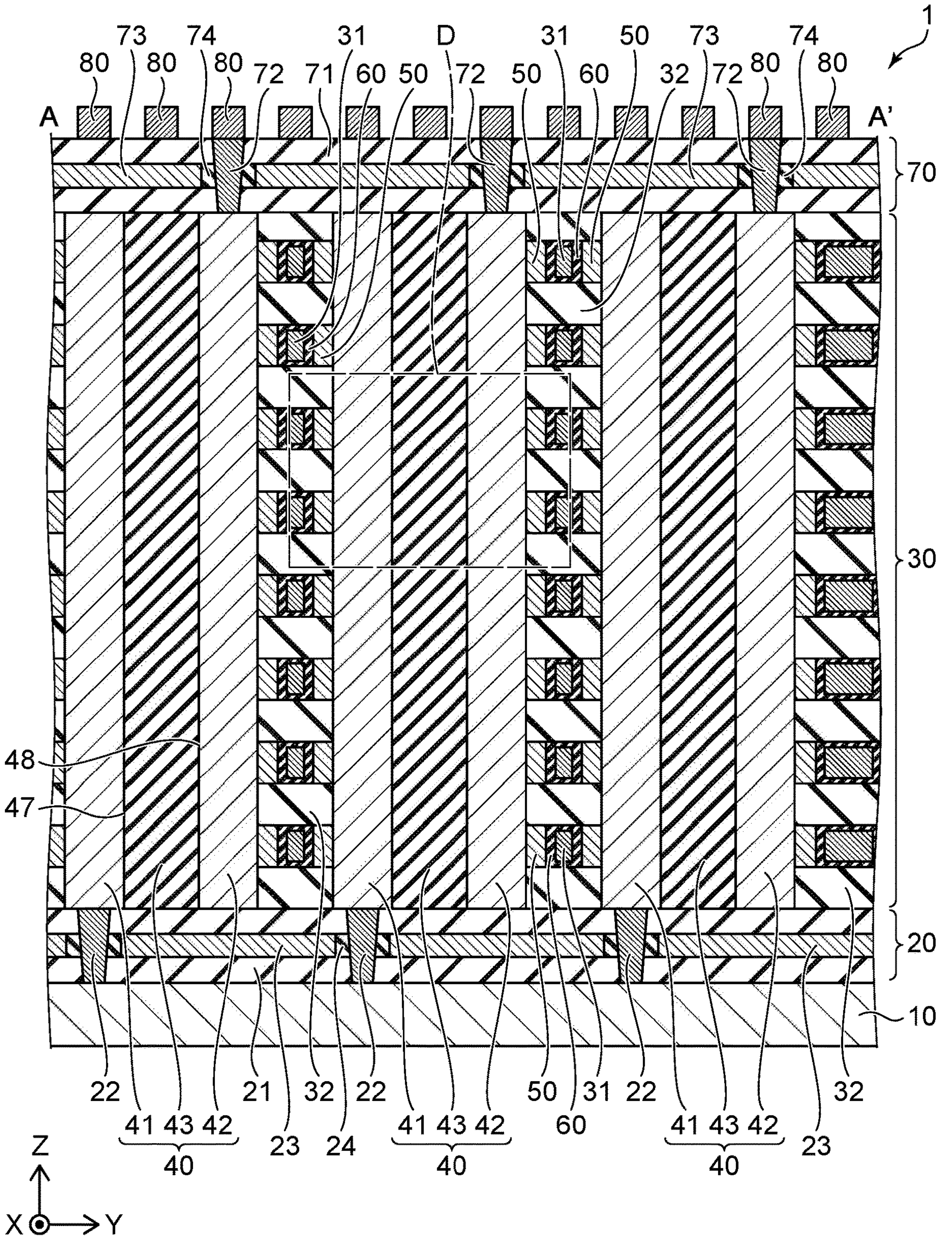
FIG. 3 is a cross-sectional view of semiconductor memory device 1 along line A-A' shown in FIG. 2.

First, lower structure 20 is formed on substrate 10. As shown in FIGS. 3 and 4, insulating film 21 is formed on substrate 10; and multiple lower semiconductor pillars 22, lower select gate electrode film 23, and multiple lower select gate insulating films 24 are formed in insulating film 21. The lower ends of lower semiconductor pillars 22 reach substrate 10.

Then, as shown in FIG. 3, FIG. 4, FIG. 7A, and FIG. 7B, inter-electrode insulating film 32 and sacrificial film 36 are alternately formed, one on top of another along the Z-direction above lower structure 20. Sacrificial film 36 is formed out of a different material than inter-electrode insulating film 32. For example, inter-electrode insulating film 32 may be formed out of silicon oxide; and sacrificial film 36 may be formed out of silicon nitride. The alternating inter-electrode insulating films and sacrificial films 36 provide initial form of stacked body 30.

Figure 8A:
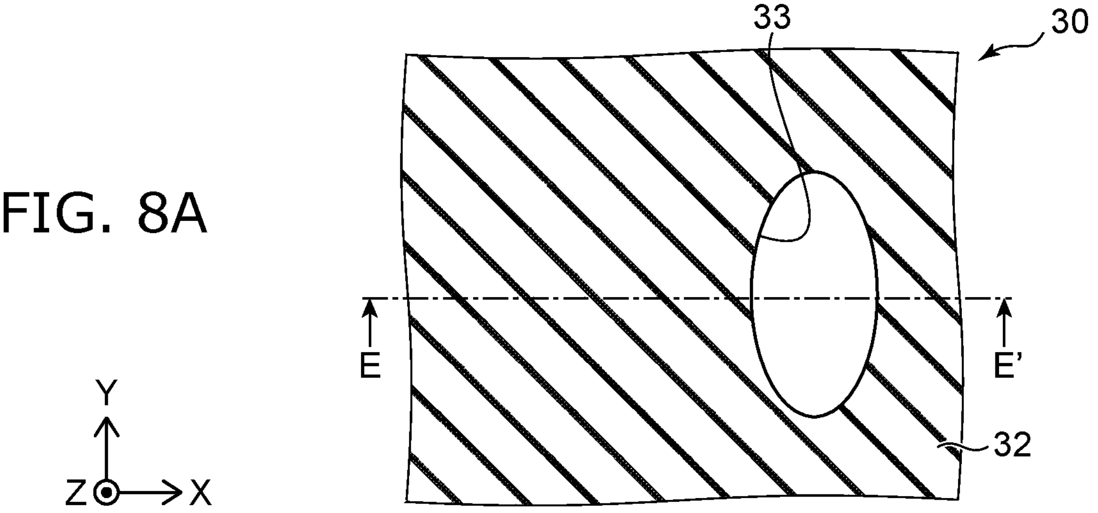
Figure 8B:
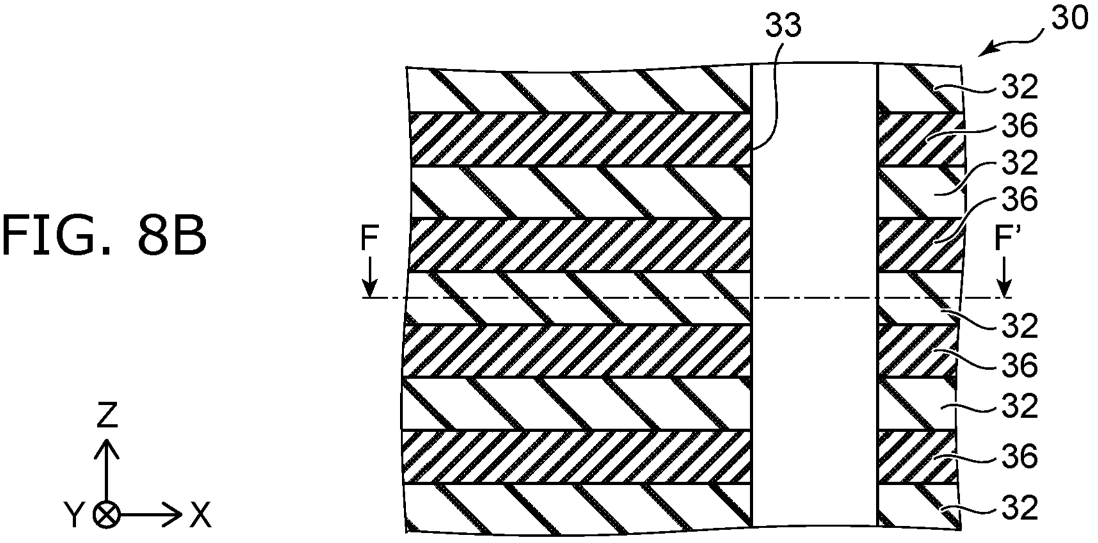

As shown in FIGS. 8A and 8B, through-hole 33 that extends in the Z-direction into stacked body 30 is formed by an anisotropic etching step (e.g., by reactive ion etching (RIE)). As shown in FIG. 2, multiple through-holes 33 may be formed in stacked body 30. Through-holes 33 each extend through the entire length of stacked body 30.

As shown in FIG. 8A, through-hole 33 has an elliptical or oval cross section in an X-Y plane. Through-hole 33 may also have a circular or rectangular cross section in an X-Y plane. In some embodiments, although it is preferred that the cross section in an X-Y plane at any point along the Z-direction remain constant, through-hole 33 may taper downward.

Figure 9A:
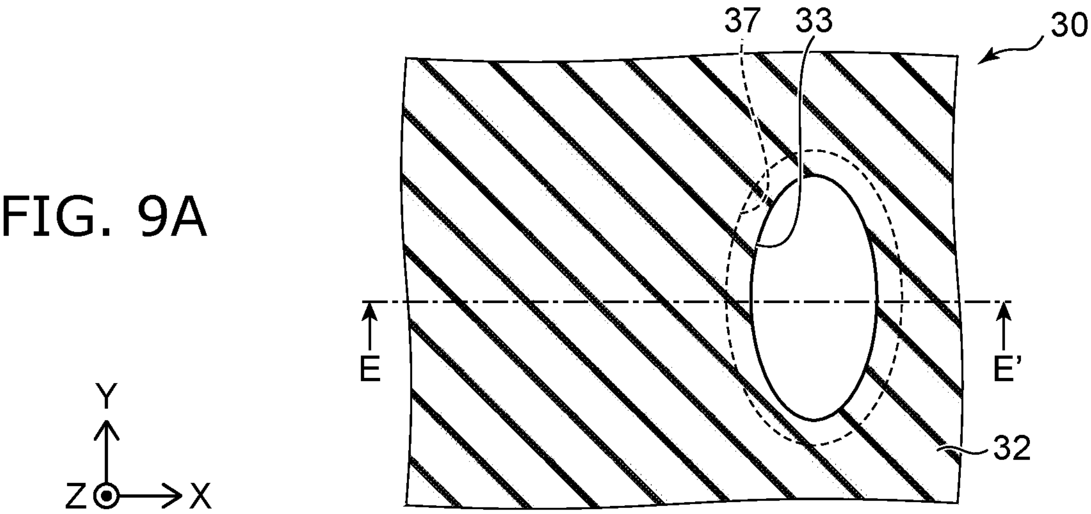
Figure 9B:
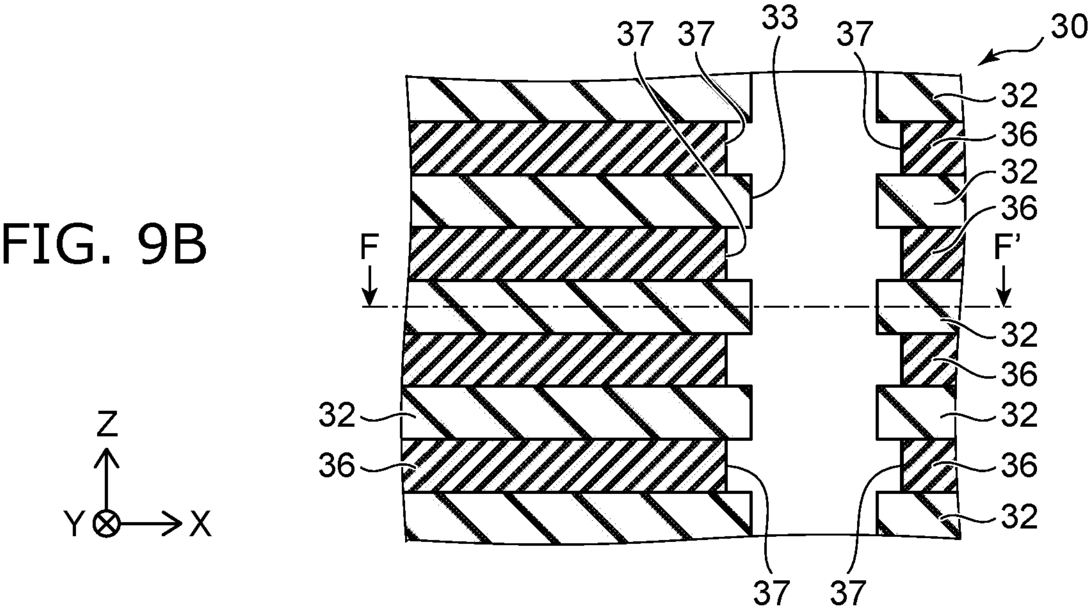

Then, as shown in FIGS. 9A and 9B, sacrificial films 36 at the exposed side surface of the through-hole 33 are selectively etched with respect to inter-electrode insulating films 32, using wet etching, for example, thereby creating recesses 37 into the side surfaces of through-holes 33. Recesses 37 are arranged along the Z-direction in each through-hole 33. Each recess 37 has a ring shape cross section in an X-Y plane through through-hole 33.

Figure 10A:
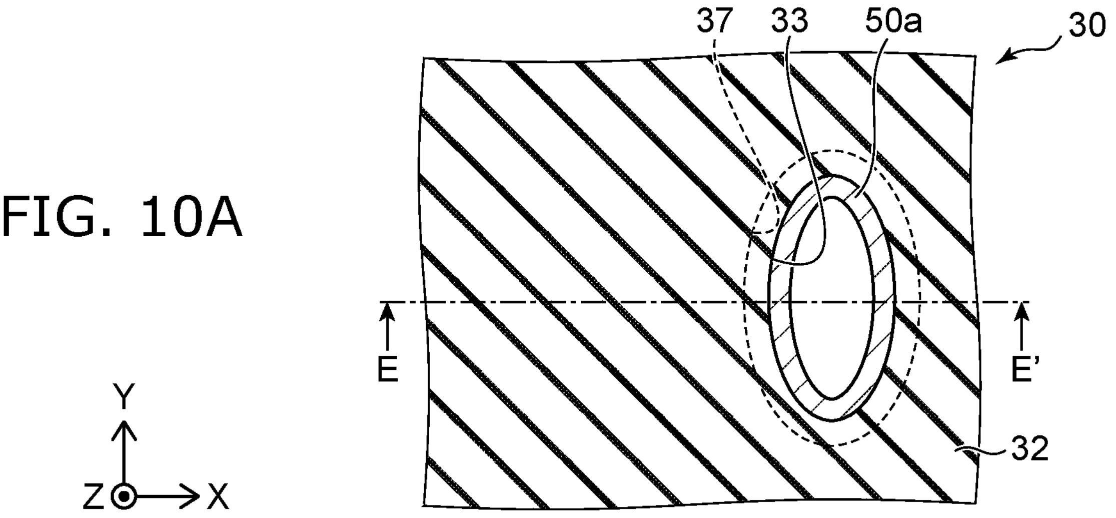
Figure 10B:
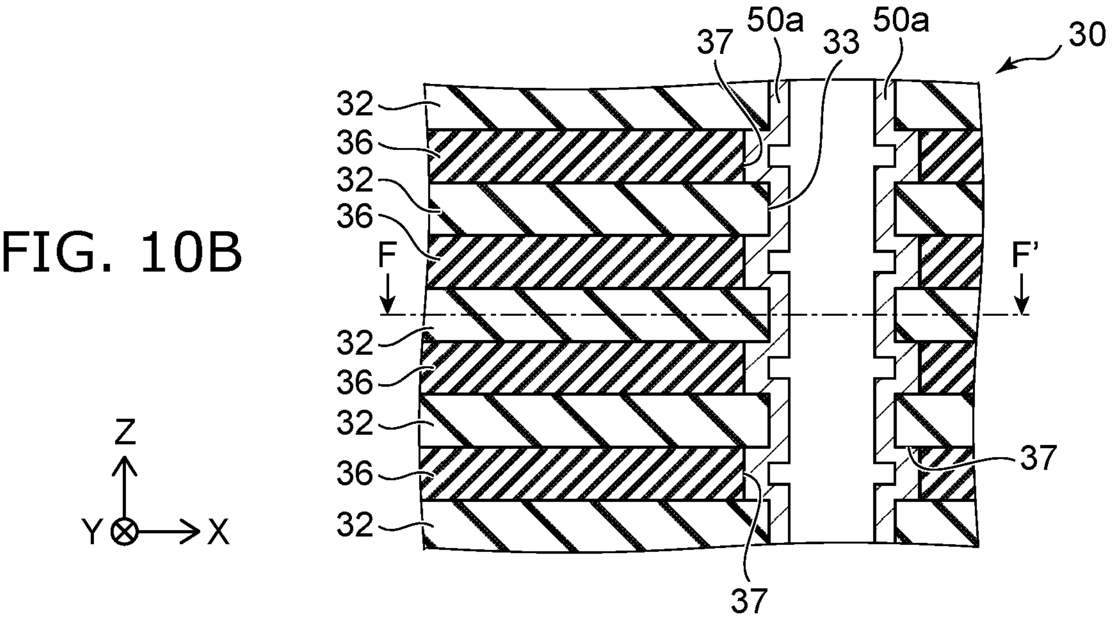

Thereafter, as shown in FIGS. 10A and 10B, a semiconductor material (e.g., p-type polysilicon) is deposited conformally, so that semiconductor layer 50*a* is formed on the side surface of through-hole 33, including the surface of recesses 37.

Figure 11A:
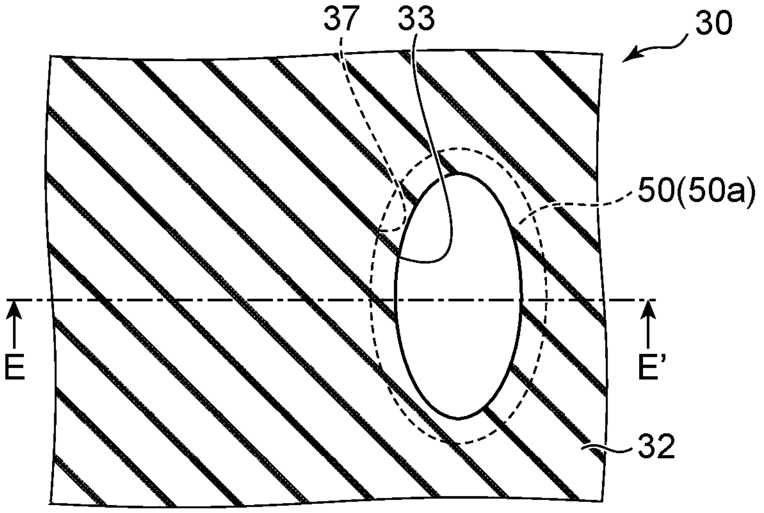
Figure 11A:
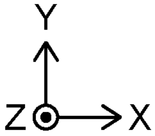
Figure 11B:
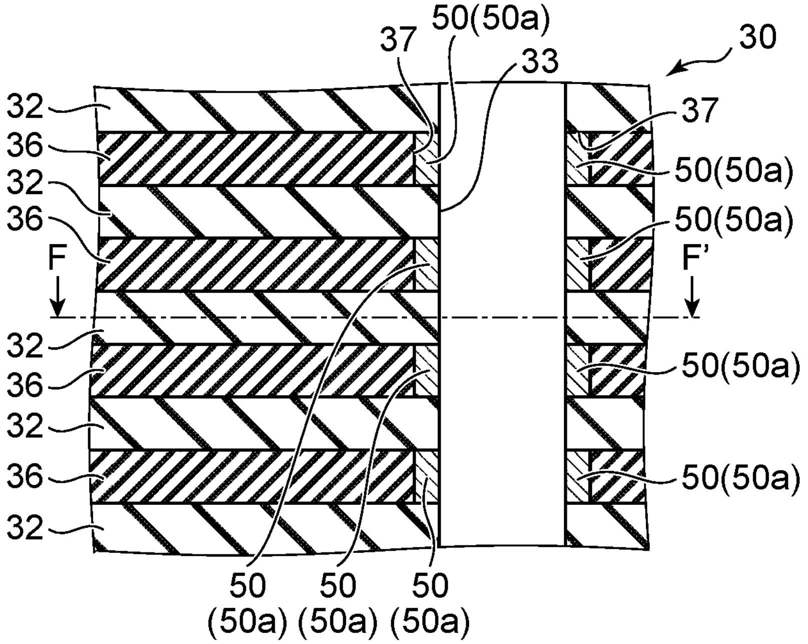
Figure 11B:
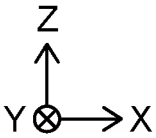

Then, as shown in FIGS. 11A and 11B, an anisotropic etching step (e.g., RIE) removes the portions of semiconductor layer 50*a* outside of recesses 37, such that substantially only the portions of semiconductor layer 50*a* inside recesses 37 remain. As the portions of semiconductor 50*a* are mutually separated, they form semiconductor members 50.

As shown in FIGS. 12A-12C, a semiconductor material (e.g., n-type polysilicon) is then provided to fill through-hole 33, forming semiconductor pillar 45. Semiconductor pillar 45 conforms to through-hole 33 (e.g., elliptical or oval). Semiconductor pillar 45 contacts semiconductor members 50 and inter-electrode insulating films 32 along the Z-direction that are previously exposed by through-hole 33. The lower end of semiconductor pillar 45 connects to lower semiconductor pillar 22.

Figure 13A:
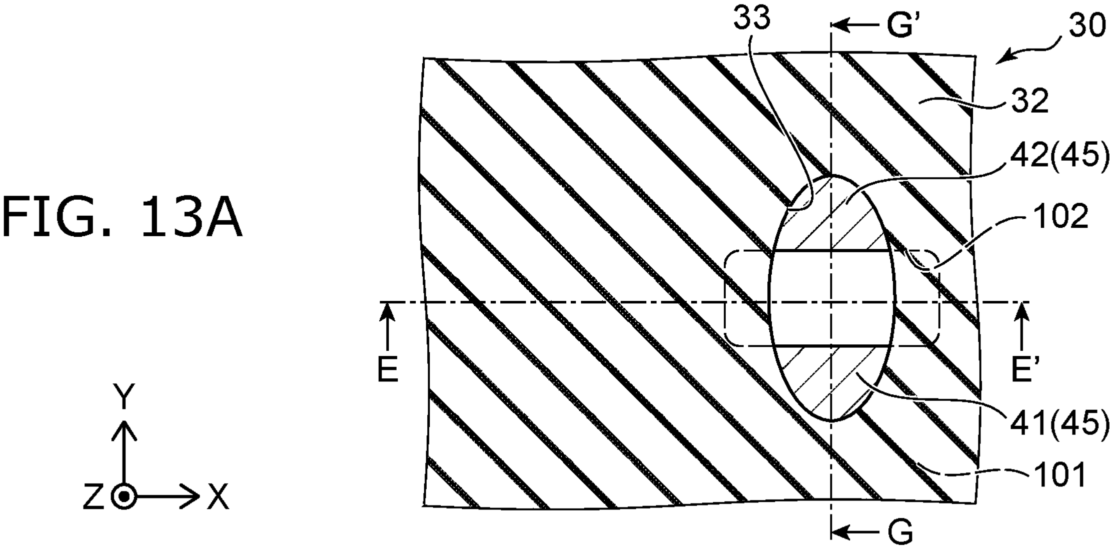
Figure 13B:
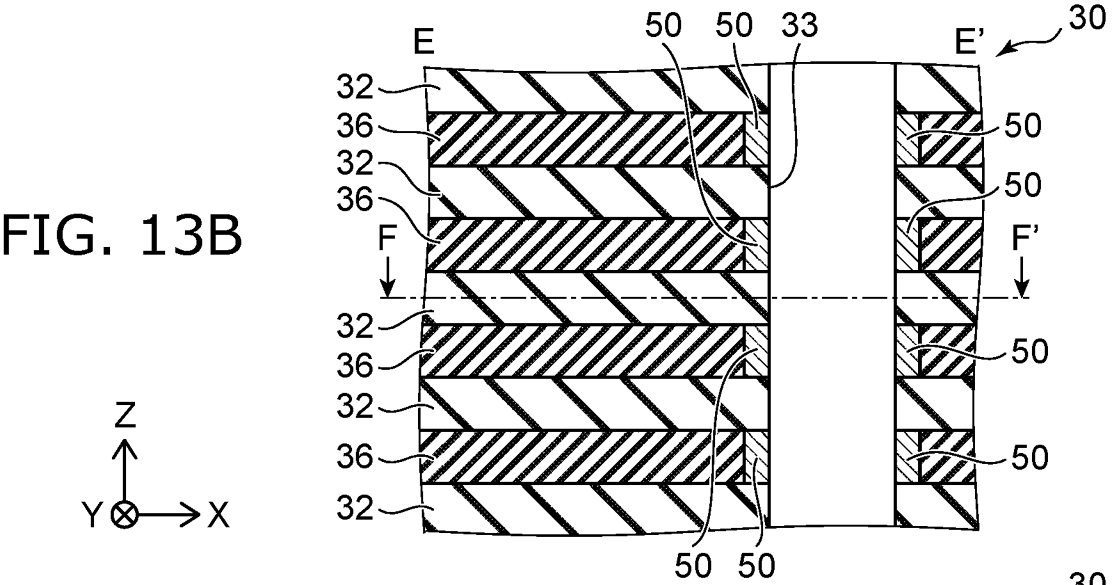
Figure 13C:
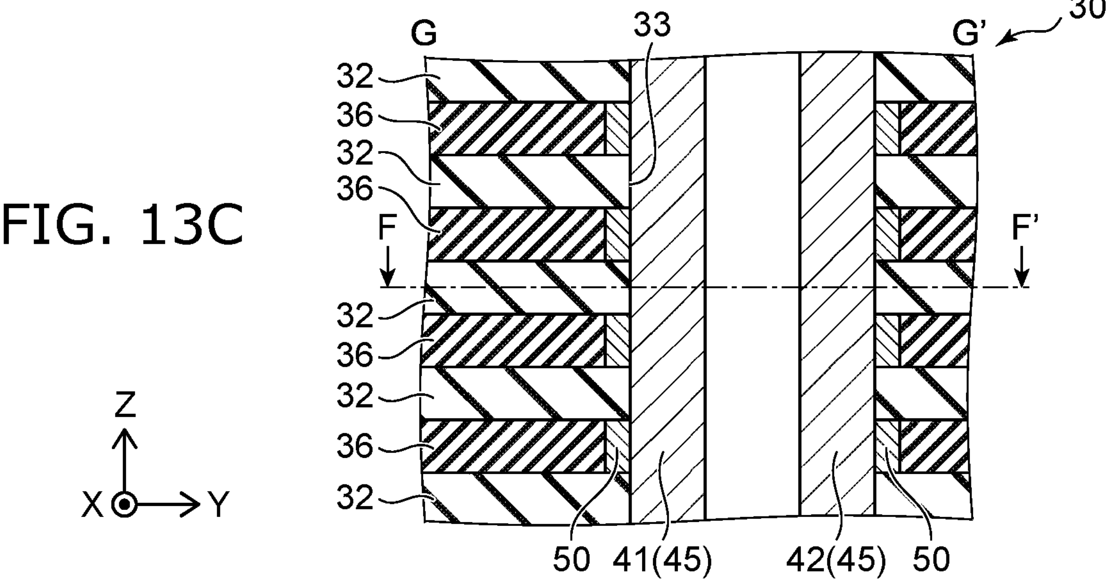

Then, as shown in FIGS. 13A-13C, resist mask 101 is formed on stacked body 30 with opening 102, which exposes a portion of semiconductor pillar 45. In FIG. 13A, which is a plan view of an X-Y cross section of stacked body 30, opening 102 is shown in dash lines projected onto this cross section. In this embodiment, opening 102 exposes a portion of semiconductor pillar 45 between two end portions at opposite ends of a major axis of semiconductor pillar 45. In FIG. 13A, opening 102 intersects semiconductor pillar 45 at two mutually parallel straight sides, each extending along the X-direction.

An anisotropic etching step (e.g., RIE) excavates the portion of semiconductor pillar 45 that is exposed by opening 102, leaving behind the two end portions of semiconductor pillar 45 as separate pillars. The portions of the separated pillars within stacked body 30 have been referred to herein as source pillar 41 and drain pillar 42. As described above, source pillar 41 and drain pillar 42 each extend along the Z-direction, separated from each other along the Y-direction. The portion of semiconductor pillar 45 to which lower semiconductor pillar 22 connects becomes source pillar 41.

Figure 14A:
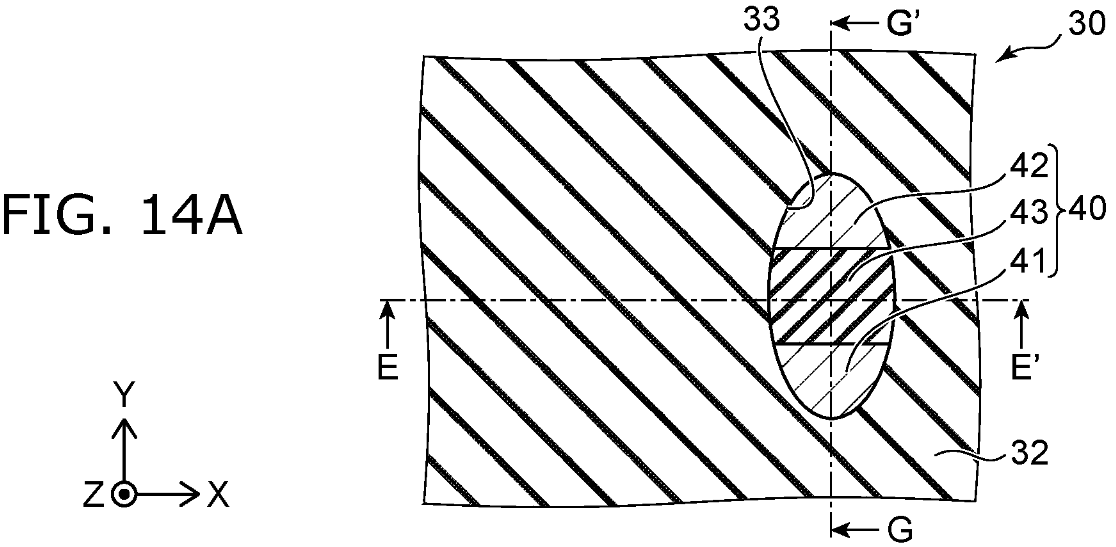
Figure 14B:
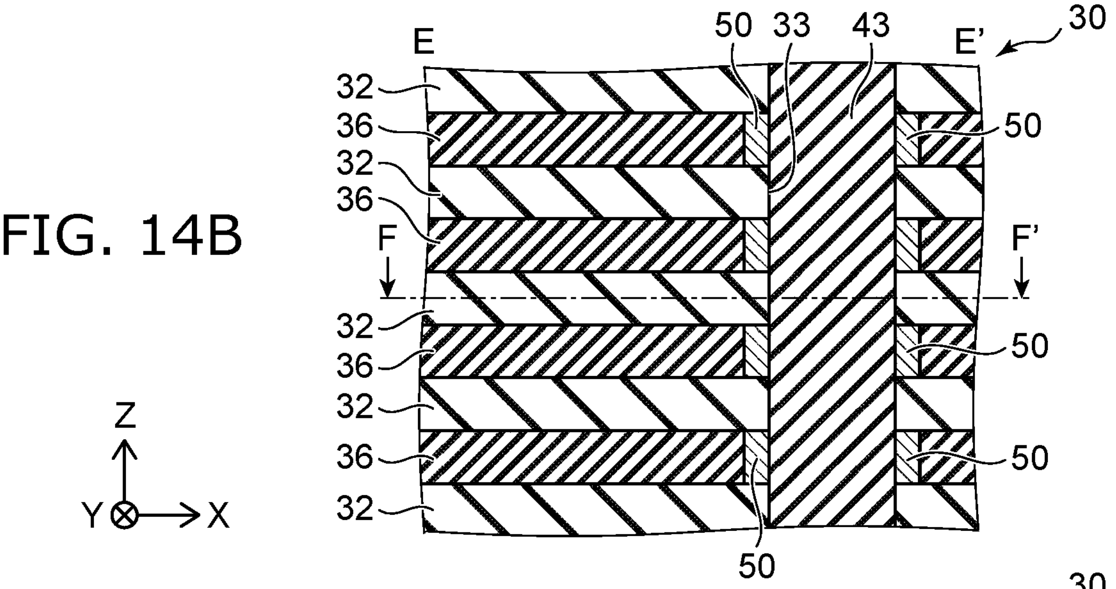
Figure 14C:
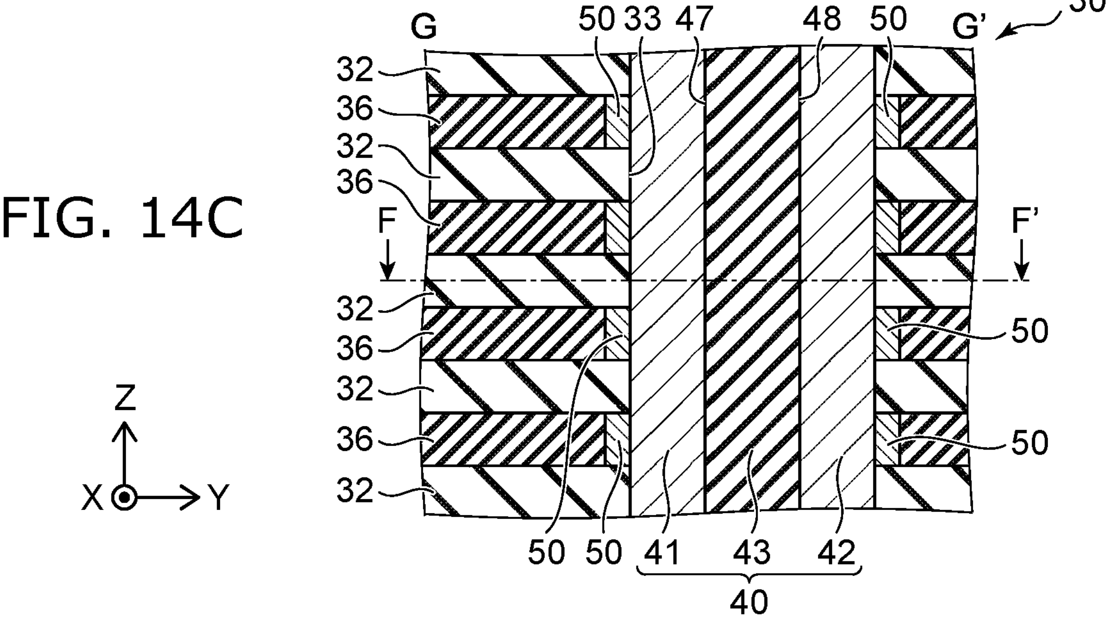

As shown in FIGS. 14A-14C, an insulating material is then deposited to fill excavated through-hole 33. The insulating material may be of a single composition, thus forming insulator pillar 43.

Figure 15A:
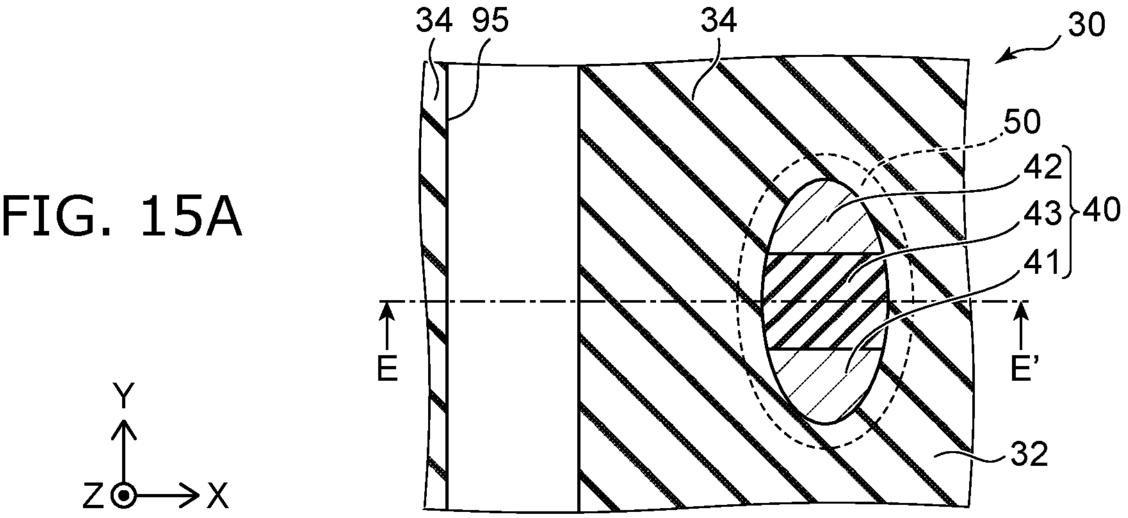
Figure 15B:
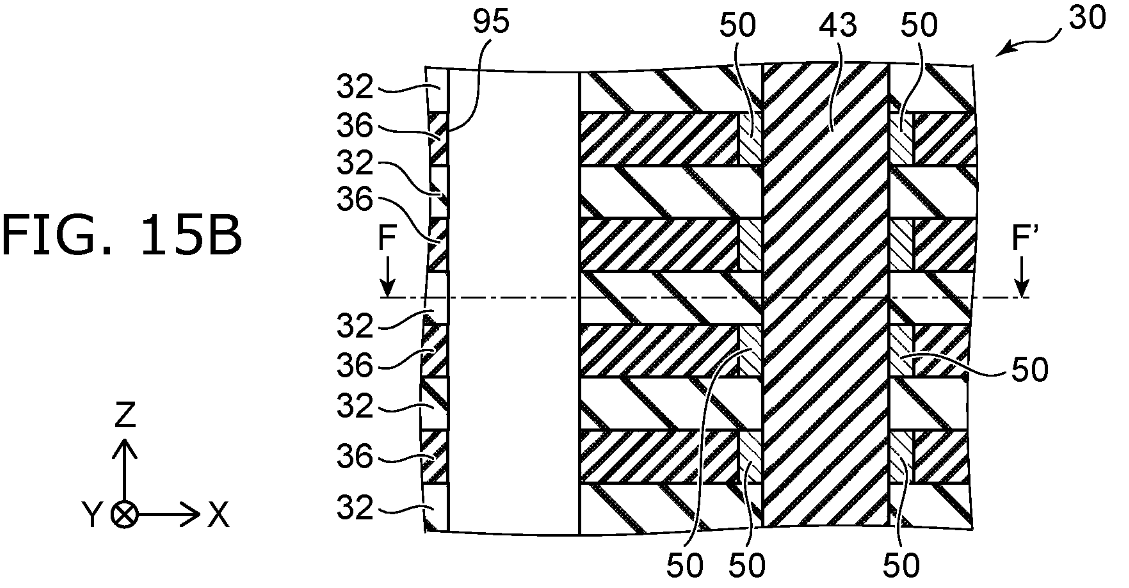

Thereafter, as shown in FIGS. 15A-15B, trench 95 is formed using an anisotropic etching step (e.g., RIE). Trench 95 extends lengthwise along the Y-direction and reaches depth-wise to substrate 10 along the Z-direction through stacked body 30 and lower structure 20, Trench 95 divides stacked body 30 and lower structure 20 into multiple portions 34 at predetermined intervals along the X-direction.

Figure 16A:
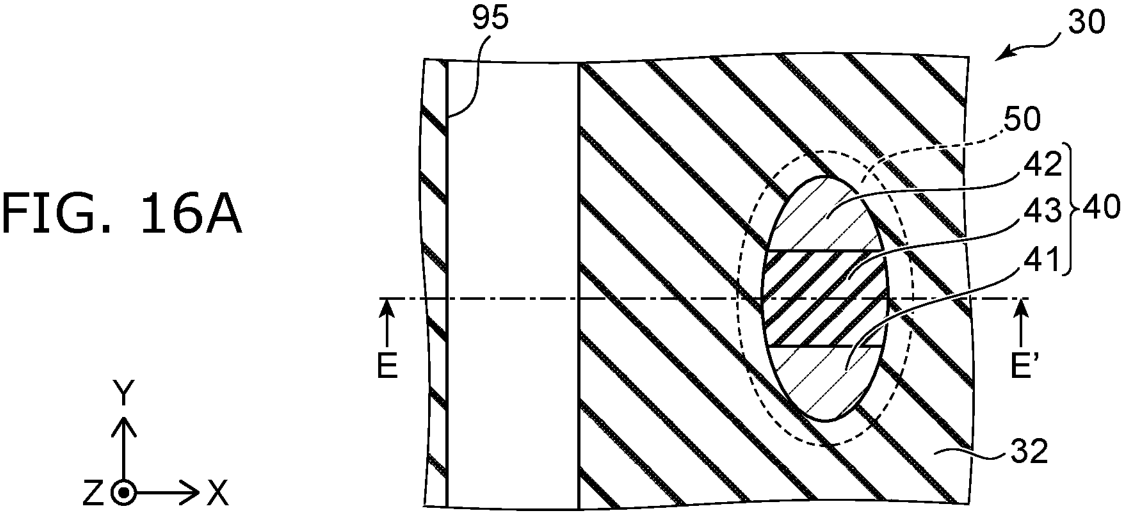
Figure 16B:
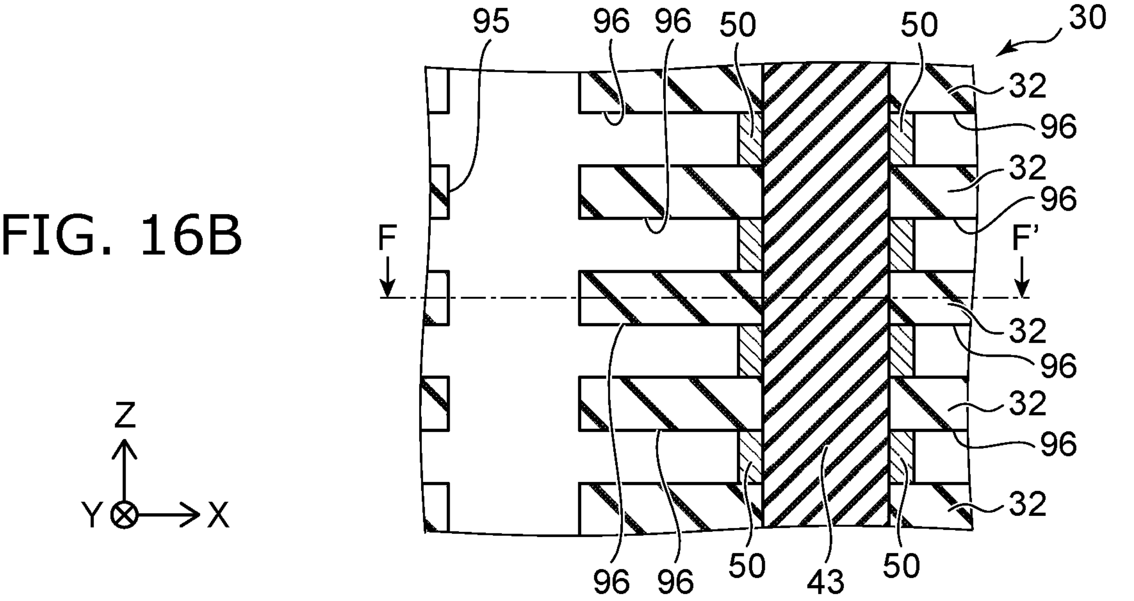

Then, as shown in FIGS. 16A-16B, sacrificial films 36 are removed via trench 95 using an isotropic etching step (e.g., a suitable wet etch), forming cavity 96 after sacrificial films 36 are removed.

Figure 17A:
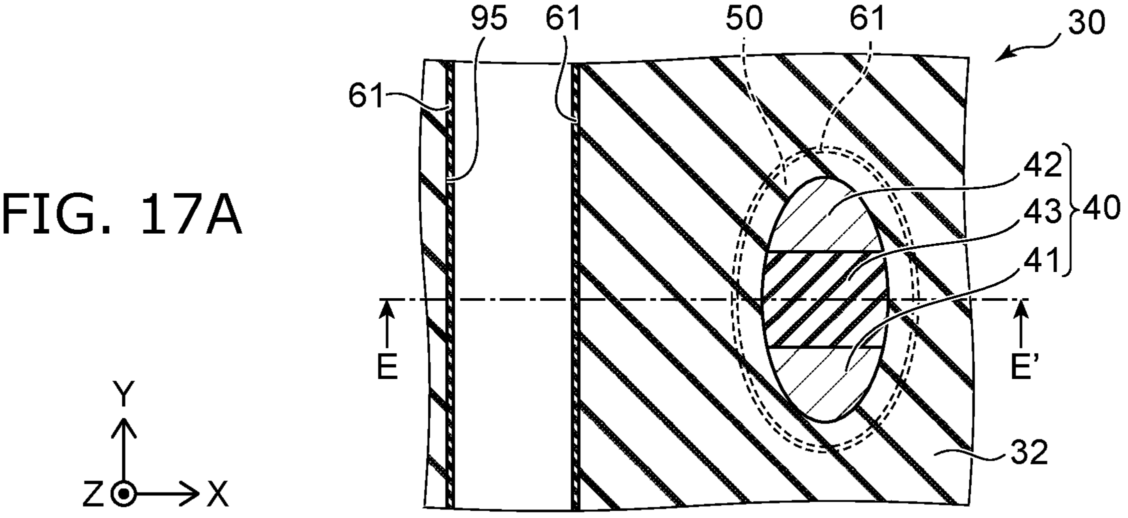
Figure 17B:
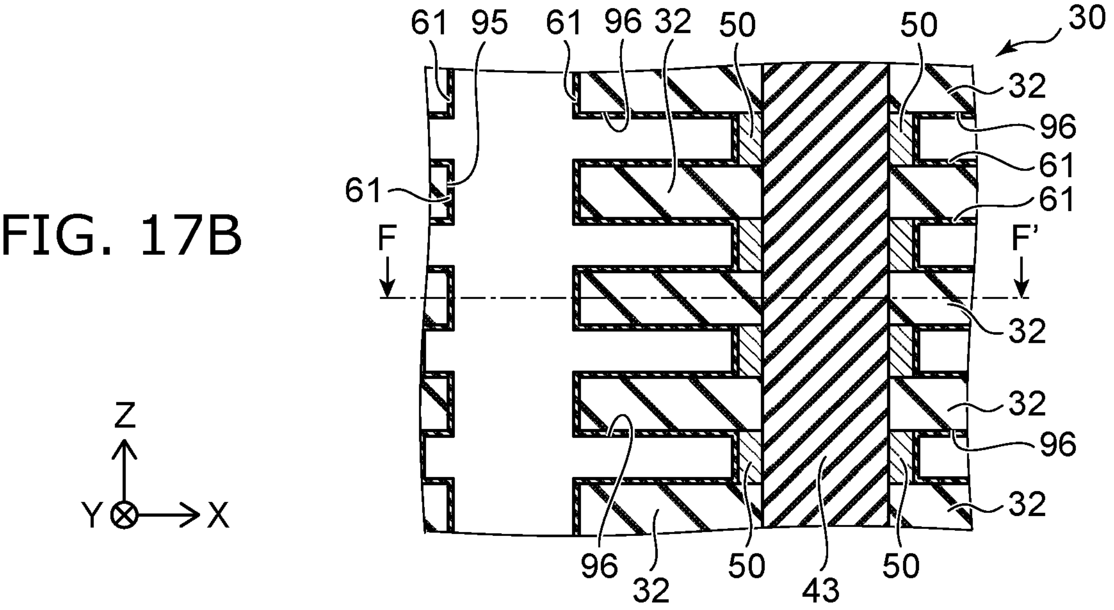

Thereafter, as shown FIGS. 17A-17B, interface insulating layer 61 is formed on the inner surfaces of trench 95 and cavity 96. Interface insulating layer 61 is an optional barrier or adhesive layer. Therefore, interface insulating layer 61, being optional, is not illustrated in the remainder of the drawings.

Figure 18A:
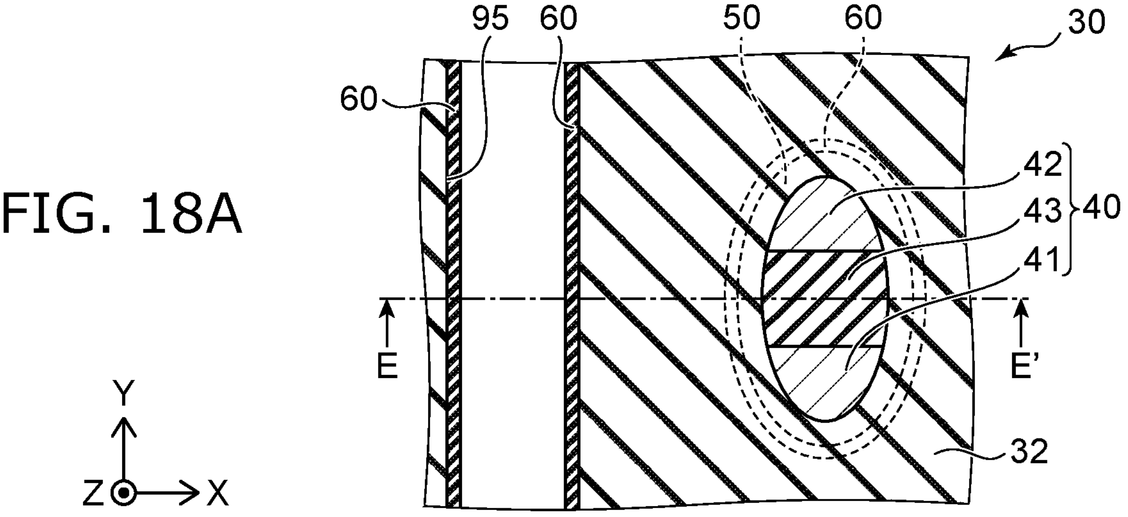
Figure 18B:
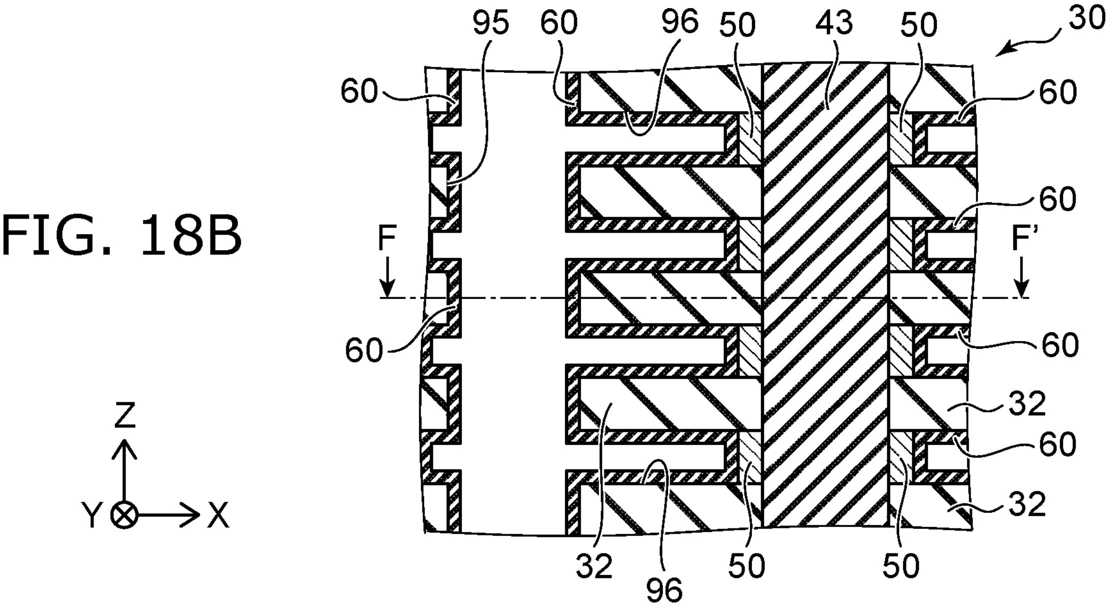

A ferroelectric material is deposited via trench 95, as shown in FIGS. 18A-18B. (Interface insulating layer 61 is now omitted.) As shown in FIG. 18B, ferroelectric layer 60 is formed conformally on the inner surfaces of trench 95 and cavity 96. When interface insulating layer 61 is provided, ferroelectric layer 60 is formed on the exposed surfaces of interface insulating layer 61.

Figure 19A:
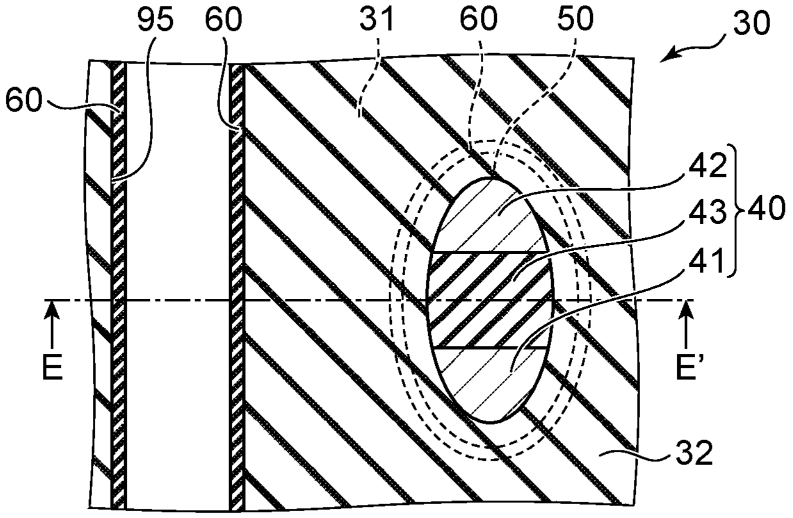
Figure 19B:
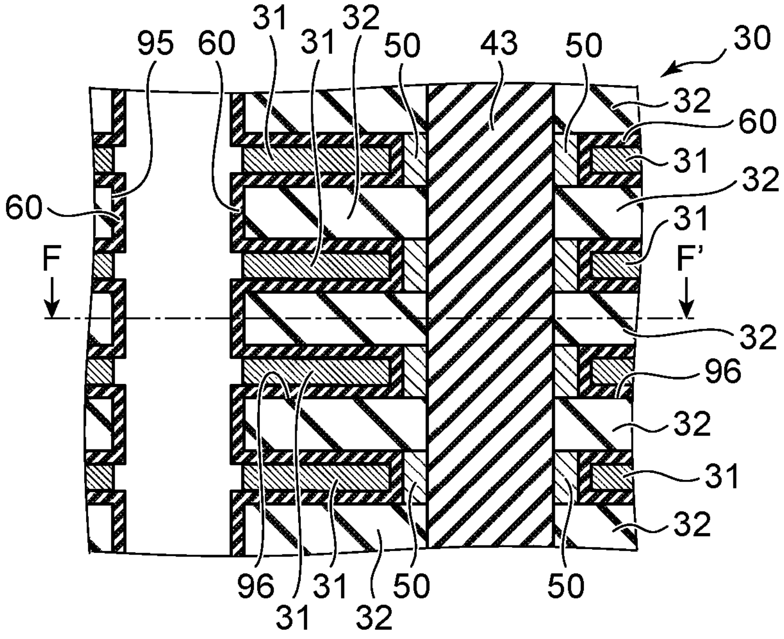

As shown in FIGS. 19A-19B, a conductive material is deposited into trench 95 and cavity 96. Thereafter, an anisotropic etching step (e.g., RIE) removes the portion of the conductive material in trench 95, so that the portions of the conductive material located in cavities 96 are separated from each other. These portions of the conductive material in cavities 96 form electrode films 31. At this time, ferroelectric layer 60 and interface insulating layer 61 on the side surfaces of trench 95 may be removed. FIGS. 1 and 3 show the embodiment in which ferroelectric layer 60 is removed from the side surface of trench 95.

Figure 20A:
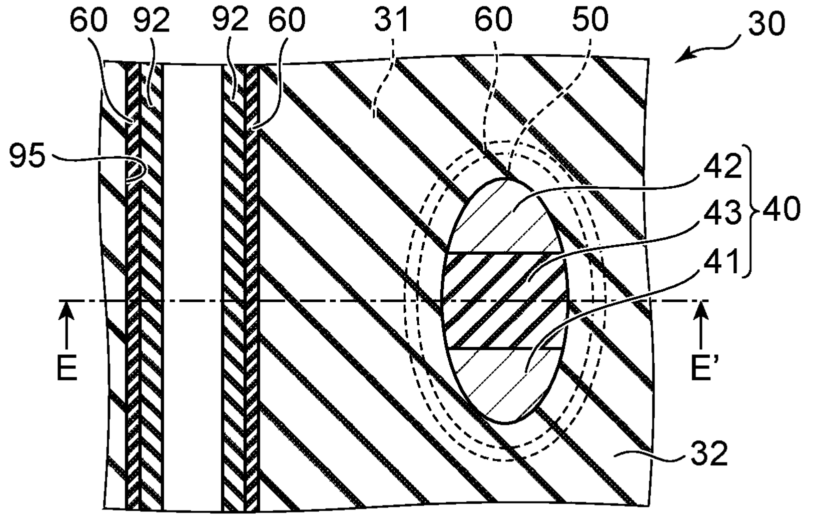
Figure 20B:
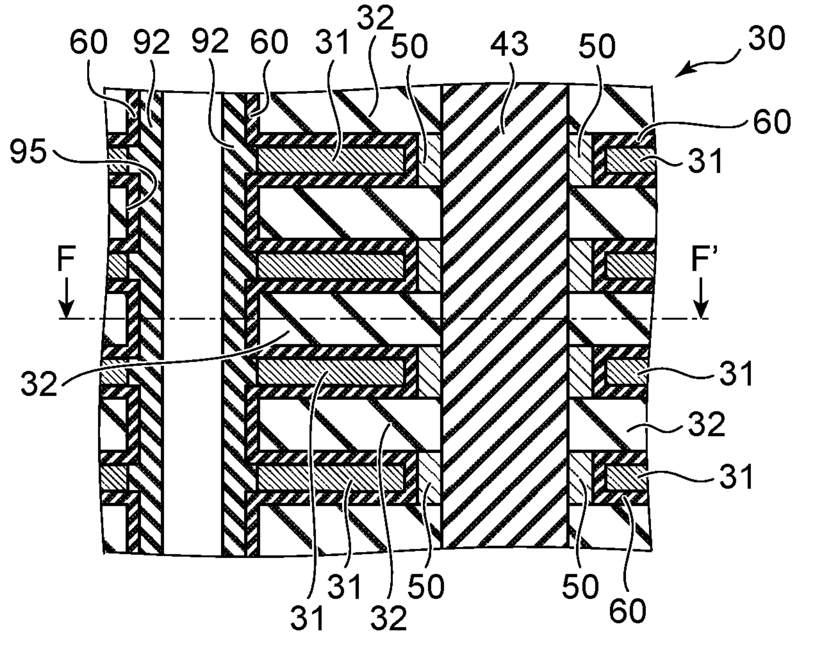

Then, as shown in FIGS. 20A-20B, an insulating material is deposited on the inner surface of the trench 95. An anisotropic etching step (e.g., RIE) then removes the insulating material from the bottom surface of trench 95, leaving the insulating material on the side surfaces of the trench 95 as insulating plates 92.

Figure 21A:
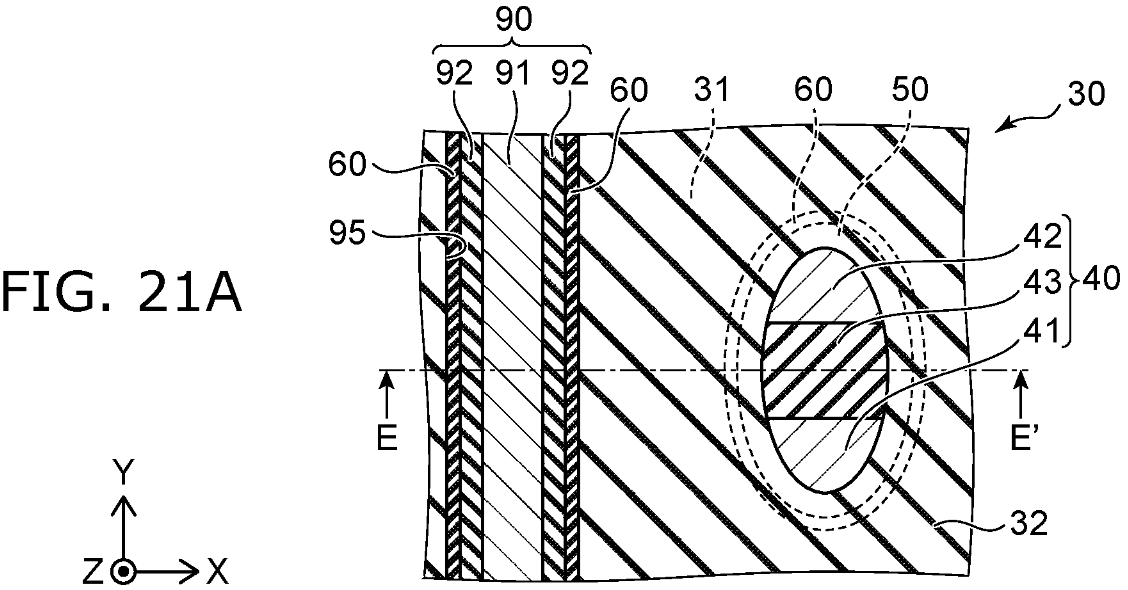
Figure 21B:
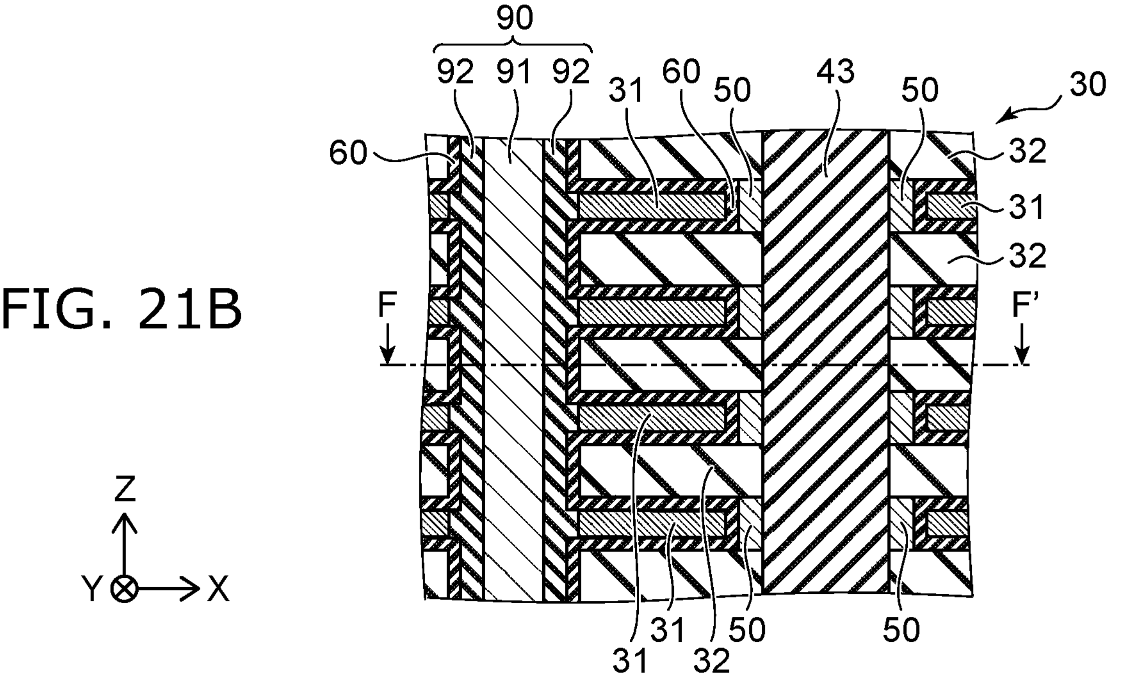

As shown in FIGS. 21A and 21B, a conductive material then fills trench 95, forming conductive plate 91 between the insulating plates 92 in trench 95. The lower end of conductive plate 91 connects substrate 10. ST structure 90 is thereby complete.

Then, as shown in FIGS. 1-4, insulating film 71 is formed on stack body 30. Then, upper semiconductor pillars 72, upper select gate electrode film 73, and upper select gate insulating films 74 are formed in insulating film 71. The lower end of upper semiconductor pillar 72 connects the upper end of the drain pillar 42. Upper structure 70 is thus formed on stacked body 30. Bit lines 80 are then formed on insulating film 71. Bit lines 80 connect to the upper ends of upper semiconductor pillars 72. Then, an insulating film (not illustrated) is provided to cover bit lines 80 on upper structure 70. Thus, semiconductor memory device 1 is formed, in accordance with one embodiment of the present invention.

Operations

Figure 5A:
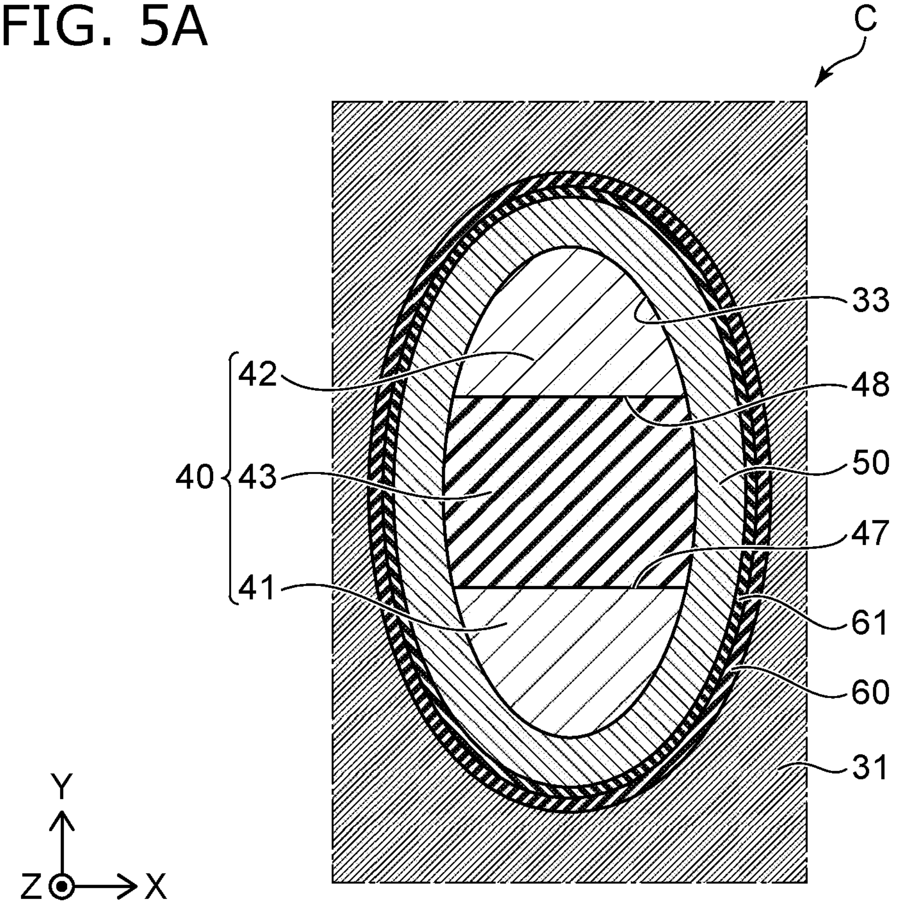
FIGS. 5A and 5B are partially enlarged cross-sectional views showing semiconductor memory device 1 of FIG. 1.
Figure 5B:
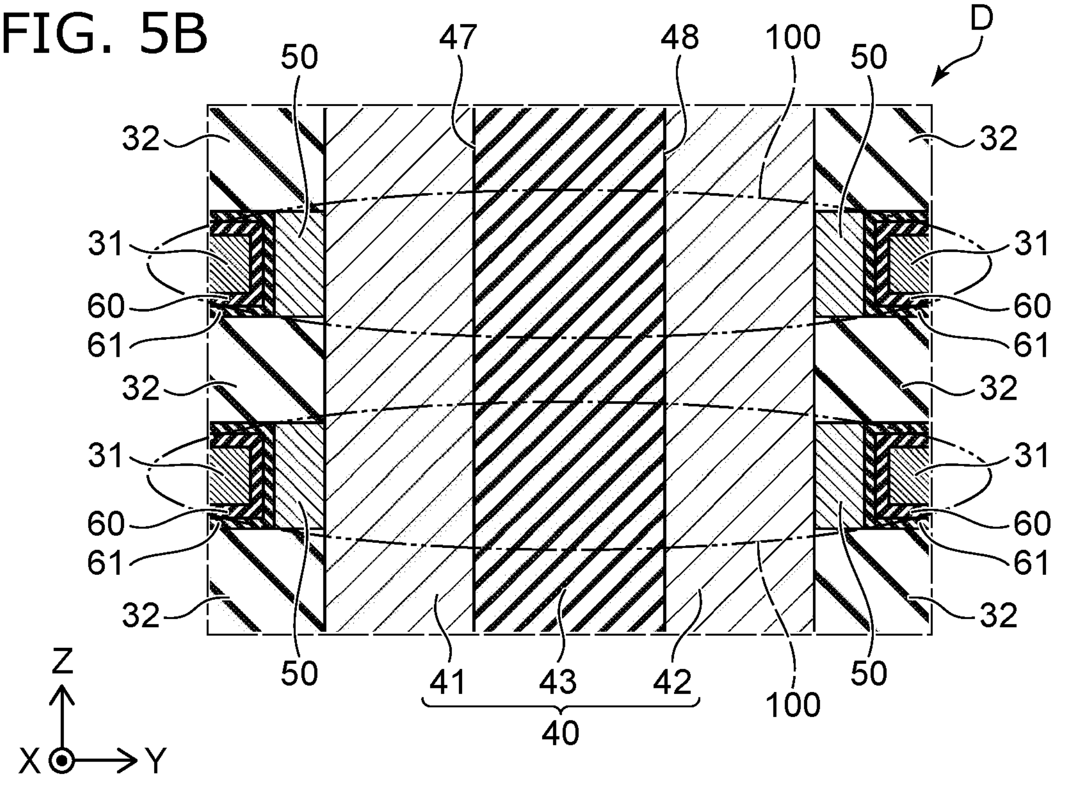
Figure 6:
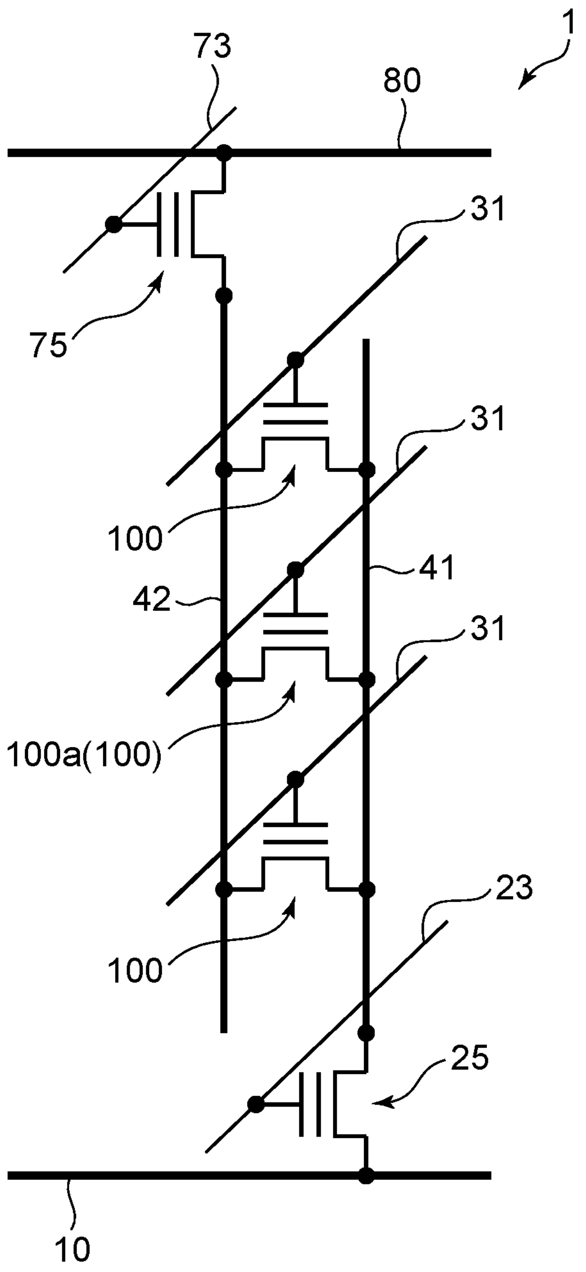
FIG. 6 is a circuit diagram representative of semiconductor memory device 1 of FIG. 1.

In semiconductor memory device 1, as shown in FIGS. 5B and 6, memory cell transistor 100 is formed where one of pillar bodies 40 and one of electrode films 31 meet. In memory cell transistor 100, source pillar 41 provides a source region, drain pillar 42 provides a drain region, semiconductor member 50 provides a channel region, and electrode film 31 provides a gate electrode. A potential is applied from the bit line 80 to the drain pillar 42 via the upper semiconductor pillar 72; and a potential is applied from the conductive plate 91 to the source pillar 41 via the substrate 10 and the lower semiconductor pillar 22. When a potential difference is applied to drain pillar 42 and source pillar 41 relative to the gate electrode, the threshold voltage of memory cell transistor 100 is changed as a result of a change in orientation of an electric field polarization in ferroelectric layer 60. The threshold voltage thus set represents the data stored in memory cell transistor 100. More than one bit may be stored in memory cell transistor 100 by polarizing ferroelectric layer 60 in more than one domain, or by forming ferroelectric layer 60 out of an anti-dielectric material.

A portion of memory cell transistors 100 may serve as pre-charge transistors (labeled pre-charge transistor 100*a* in FIGS. 1 and 6). Pre-charge transistor 100*a*, when rendered conducting, connects drain pillar 42 and source pillar 41, thereby equalizing the voltages on drain pillar 42 to source pillar 41.

In lower structure 20, source-side select transistor 25 is formed where one of lower semiconductor pillars 22 and one of lower select gate electrode films 23 meet. In source-side select transistor 25, lower semiconductor pillar 22 provides a channel region, lower select gate electrode film 23 provides a gate electrode, and lower select gate insulating film 24 provides a gate insulating or dielectric film. Source-side select transistor 25 controls whether or not source pillar 41 connects to substrate 10.

Substrate 10, which is connected to lower semiconductor pillar 22, can also serve as a channel region. For such a purpose, a source capacitance that includes the substrate capacitance can be formed by inverting to n-type the portion of substrate 10 that contacts conductive plate 91, for example, while the remainder portion of substrate 10 is held at p-type. In such a configuration, performance degradation due to insufficient capacitance that may develop at the source side during a read operation may be avoided. When source pillar 41 has a sufficient capacitance, semiconductor memory device 1 can be operated without lower select gate electrode film 23.

In upper structure 70, drain-side select transistor 75 is formed where one of upper semiconductor pillars 72 and one of upper select gate electrode films 73 meet. In drain-side select transistor 75, upper semiconductor pillar 72 provides a channel region, upper select gate electrode film 73 provides a gate electrode, and upper select gate insulating film 74 provides a gate insulating or dielectric film. Drain-side select transistor 75 controls whether or not drain pillar 42 connects bit line 80.

FIG. 6 shows a memory string in semiconductor memory device 1, in which multiple memory cell transistors 100 are each connected in series with drain-side select transistor 75 and source-side select transistor 25. The memory string is connected in series between bit line 80 and substrate 10. Memory cell transistors 100 each store data. One or more memory cell transistors 100 may serve as a pre-charge transistor (e.g., pre-charge transistor 100*a*), which connects drain pillar 42 and source pillar 41. As a pre-charge transistor, pre-charge transistor 100*a* would not store data.

Although source pillar 41 connects to substrate 10 via source-side select transistor 25, the voltage applied to source pillar 41 may be different from the voltage applied to elsewhere in substrate 10. For example, an n-well may be formed in an upper portion of substrate 10, a p-well may be formed in the n-well, and lower semiconductor pillar 22 and conductive plate 91 may connect to the p-well. In such a configuration, the path from conductive plate 91 to source pillar 41 via the p-well and lower semiconductor pillar 22 can be electrically isolated from the other portions of substrate 10. As a result, any voltage (e.g., any positive voltage) can be applied to conductive plate 91 and applied to source pillar 41, while applying the ground potential (e.g., "VSS") to substrate 10.

Although source-side select transistors 25 are all connected in common to substrate 10 in the embodiments described herein, the present invention is not so limited. Multiple source lines may be provided between substrate 10 and lower structure 20, and source pillars 41 may be connected to such source lines via source-side select transistors 25. For example, each source line may extend in the X-direction, and source pillars 41 of pillar bodies 40 that are arranged in one column along the X-direction may be connected to a common source line. In that configuration, different voltages may be applied to source pillars 41 situated at different Y-direction positions, so that pre-charge transistors 100*a* need not be provided. Without having to provide pre-charge transistors, for a given memory density, the number of layers in stacked body 30 may be reduced, as the voltages can be applied to source pillars 41 via the source lines.

Advantages

In semiconductor memory device 1, semiconductor members 50 are independently provided for each of electrode films 31, so that semiconductor members 50 each correspond to one of memory cell transistors 100. Consequently, reduced leakage current is achieved between adjacent ones of memory cell transistors 100 in the Z-direction. Reliable operations in semiconductor memory device 1 is thereby enhanced.

In semiconductor memory device 1, interface 47 between the source pillar 41 and insulator pillar 43 and interface 48 between drain pillar 42 and insulator pillar 43 are substantially parallel. Therefore, the distance between source pillar 41 and drain pillar 42 is substantially constant. Stability in the threshold voltage of memory cell transistor 100, the on-current, and the leakage current in the off-state are all achieved. Accordingly, reliable operations of the semiconductor memory device 1 are also achieved.

According to one embodiment of the present invention, semiconductor pillar 45 is formed according to the process illustrated by FIGS. 12A-12C. Semiconductor pillar 45 is subsequently subdivided into source pillar 41 and drain pillar 42 according to the process illustrated in FIGS. 13A-13C. Source pillar 41 and drain pillar 42 are thus formed using very few process steps, resulting in a reduced manufacturing cost.

Although source pillars 41 connect to conductive plate 91 in the embodiments described herein, other connections are within the scope of the present invention are possible. For example, source pillars 41 may connect to a circuit that may be formed in substrate 10.

Source pillar 41 may be left floating. In such a configuration, ST structure 90 may have the interior of trench 95 filled by insulating plate 92, without providing conductive plate 91. In that configuration, in forming trench 95 according to the process illustrated in FIGS. 15A-15B, the lower end of trench 95 may be positioned in insulating film 21 without trench 95 reaching substrate 10.

In some embodiments, an oxide-nitride-oxide (ONO) film may be provided instead of ferroelectric layer 60. For example, in the process illustrated by FIGS. 18A-18B, an ONO film may be formed, rather than ferroelectric layer 60. In such a semiconductor memory device, the threshold voltage of the memory cell transistor is determined by the charge stored in the ONO film.

Second Embodiment

Figure 22:
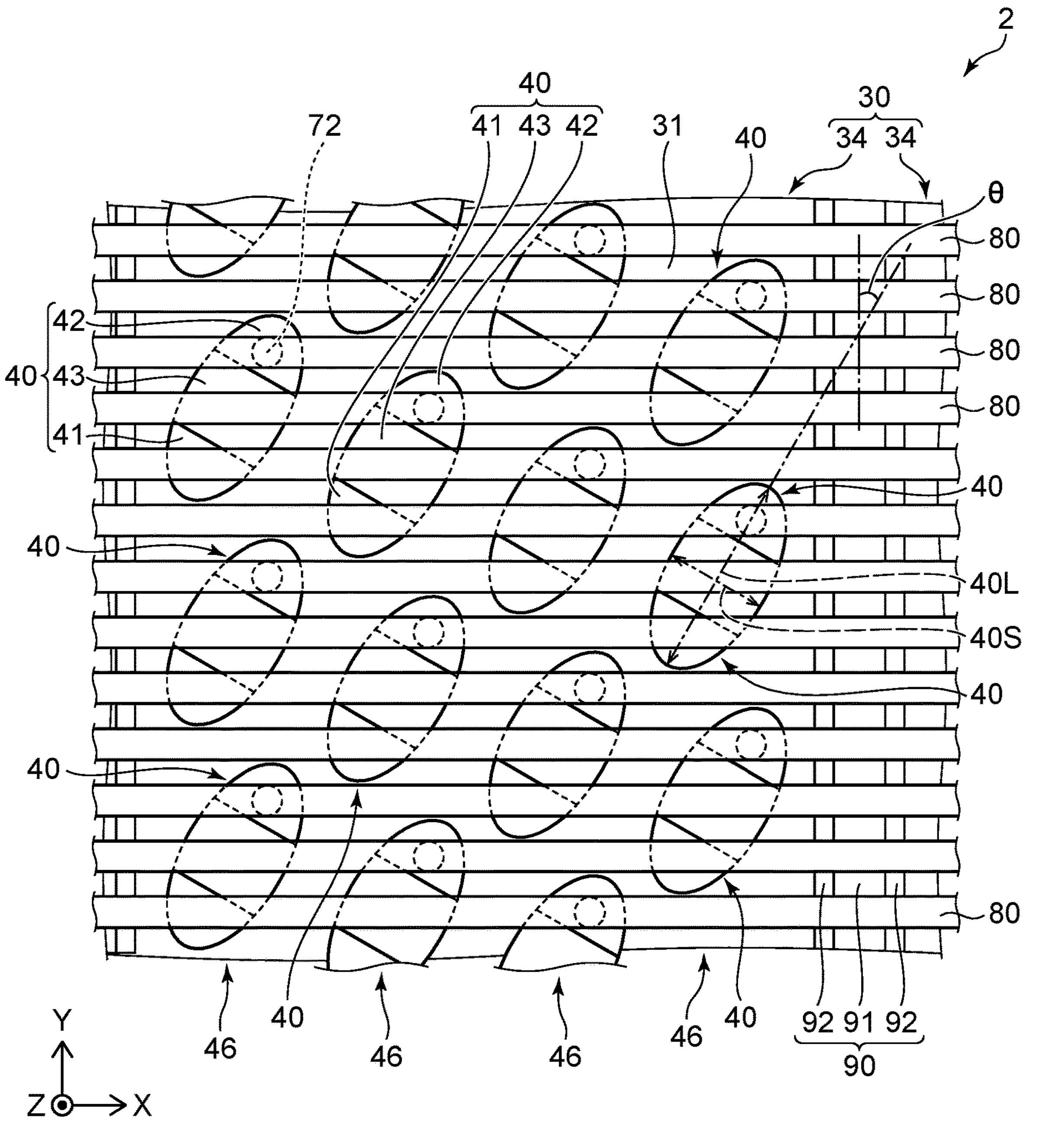
FIG. 22 is a plan view showing semiconductor memory device 2, according to a second embodiment of the present invention.

FIG. 22 is a plan view showing semiconductor memory device 2, according to a second embodiment of the present invention.

As shown in FIG. 22, semiconductor memory device 2 differs from the semiconductor memory device 1 of FIGS. 1-6 in that pillar bodies 40 are obliquely arranged. In other words, as shown in FIG. 22, pillar body 40 has an elliptical cross section in an X-Y plane oriented such that major axis 40L of pillar body 40 intersects the Y-direction (e.g., along the length of conductive plate 91) at an angle θ. It is advantageous for angle θ to be at least 3 degrees, but not more than 45 degrees, and more preferably between 10 degrees and 20 degrees. Major axis 40L of pillar body 40 is, for example, between 80 nm and 200 nm, while minor axis 40S of pillar body 40 is preferably between 50 nm and 120 nm. According to this second embodiment, the "Y-direction" is taken to be the direction in which conductive plate 91 extends.

By orienting major axis 40L of pillar body 40 at an oblique angle to the Y-direction, which is taken to be the direction along which conductive plate 91 extends, the length of pillar body 40 in the Y-direction is reduced, so that a narrower pitch of bit lines 80 can be achieved. As a result, semiconductor memory device 2 can achieve a higher degree of integration. This second embodiment achieves otherwise substantially the same configuration, the same operations, and the same effects as the first embodiment described herein. Also, this second embodiment may be manufactured using substantially the same method as that for manufacturing the first embodiment described herein.

Third Embodiment

Figure 23A:
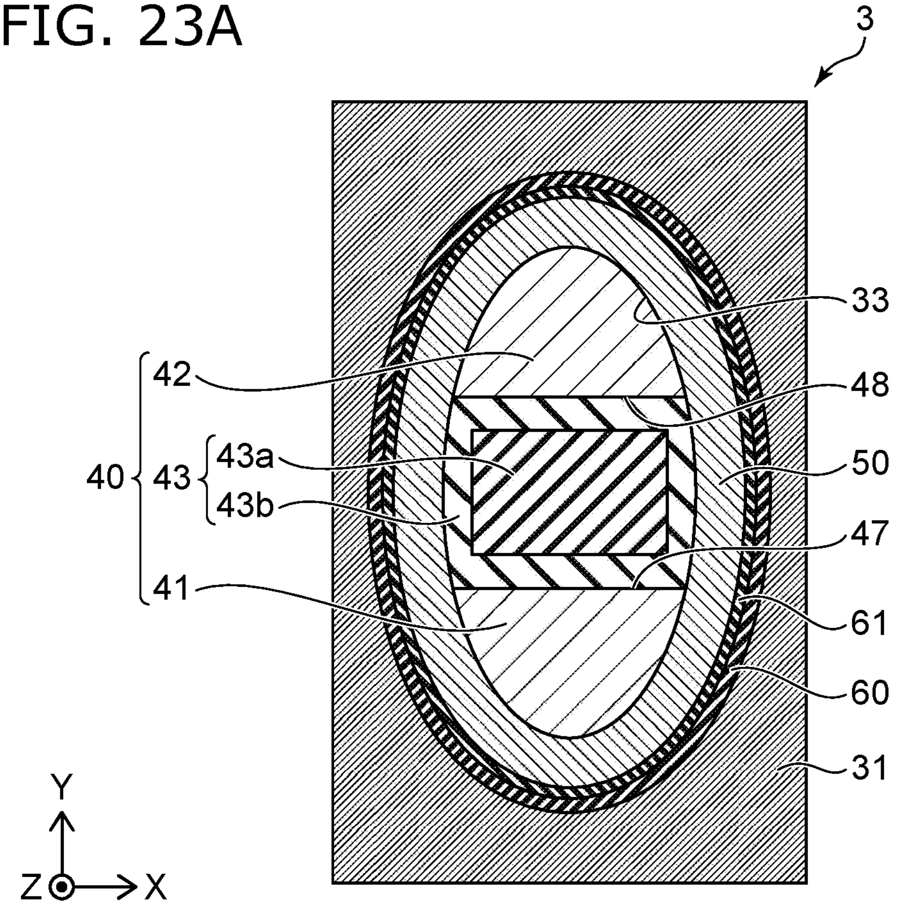
FIGS. 23A and 23B are partially enlarged cross-sectional views showing semiconductor memory device 3, according to a third embodiment of the present invention.
Figure 23B:
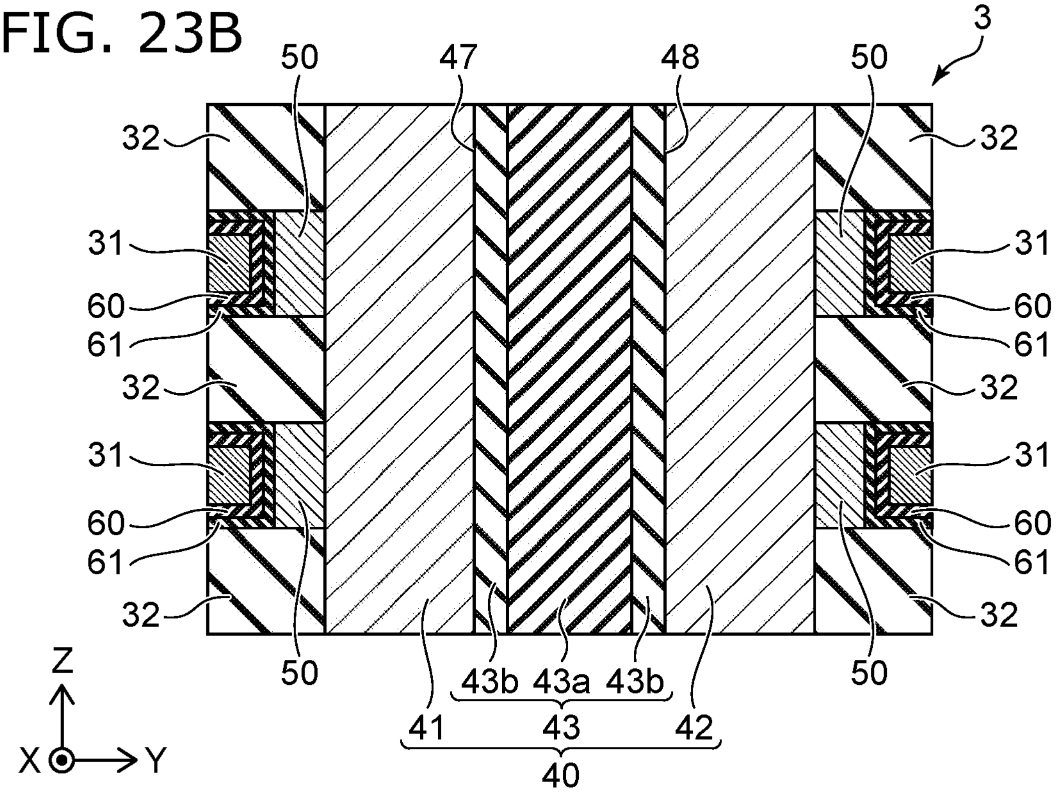

FIGS. 23A-23B are partially enlarged cross-sectional views showing semiconductor memory device 3, according a third embodiment of the present invention. In particular, FIG. 23A shows a region corresponding to region C for semiconductor memory device 1 of FIG. 2; and FIG. 23B shows a region corresponding to region D for semiconductor memory device 1 of FIG. 3.

In semiconductor memory device 3, as shown in FIGS. 23A-23B, insulator pillar 43 includes core insulating pillar **43*a* and liner insulating film 43*b*. Core insulating pillar 43*a*, which extends the length of insulator pillar 43 along the Z-direction, is separated from source pillar 41, drain pillar 42, and semiconductor member 50 by liner insulating film 43*b*. Liner insulating film 43*b* contacts source pillar 41, drain pillar 42, and semiconductor member 50**.

Core insulating pillar **43*a* may be formed out of silicon oxide deposited by chemical vapor deposition (CVD), and liner insulating film 43*b* may be formed by thermal oxidation of the silicon in source pillar 41, drain pillar 42 and semiconductor member 50. In other embodiments, liner insulating film 43*b*** may be formed out of a high-k material (e.g., aluminum oxide or alumina ($Al_2O_3$)).

In this third embodiment, liner insulating film **43*b* has high-quality (i.e., having few defects) suitable for being located adjacent semiconductor member 50, which is a channel region of memory cell transistor 100. Liner insulating film 43*b* reduces trapped fixed charge between source pillar 41 and drain pillar 42, which improves the electrical characteristics of memory cell transistor 100. At the same time, core insulating pillar 43*a*** may be more efficiently formed by CVD. This third embodiment achieves otherwise substantially the same configuration, the same operations, and the same effects as the first embodiment described herein. Also, this third embodiment may be manufactured using substantially the same method as that for manufacturing the first embodiment described herein.

Fourth Embodiment

Figure 24A:
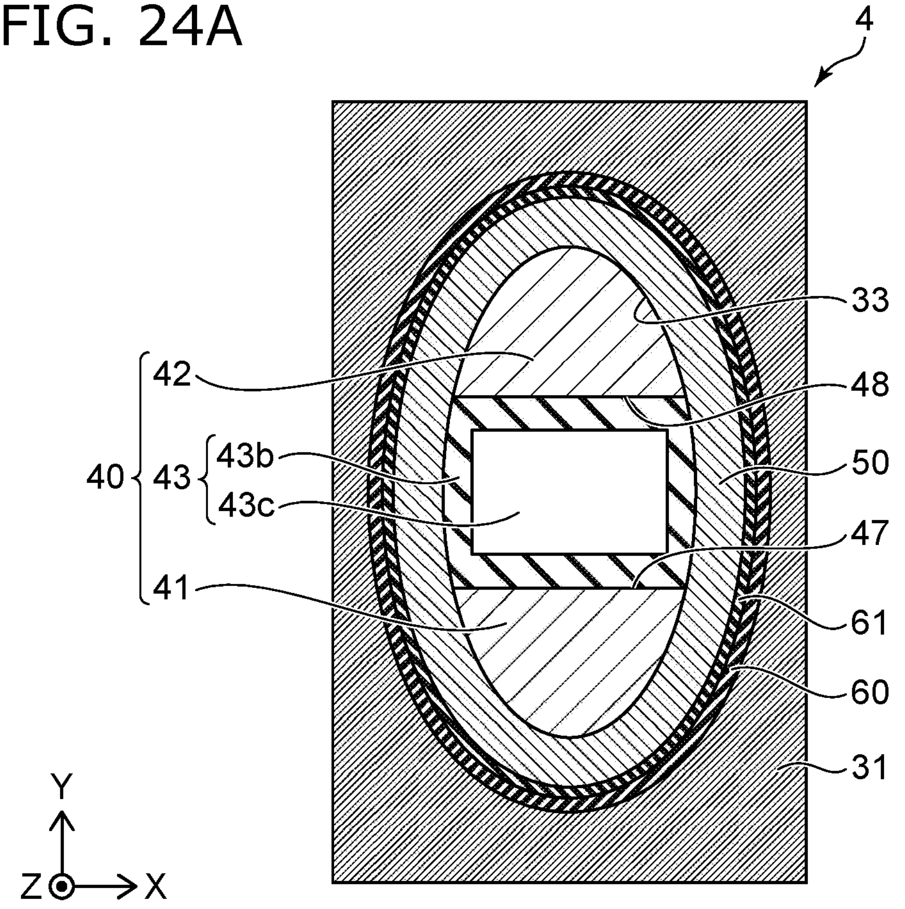
FIGS. 24A and 24B are partially enlarged cross-sectional views showing semiconductor memory device 4, according to a fourth embodiment of the present invention.
Figure 24B:
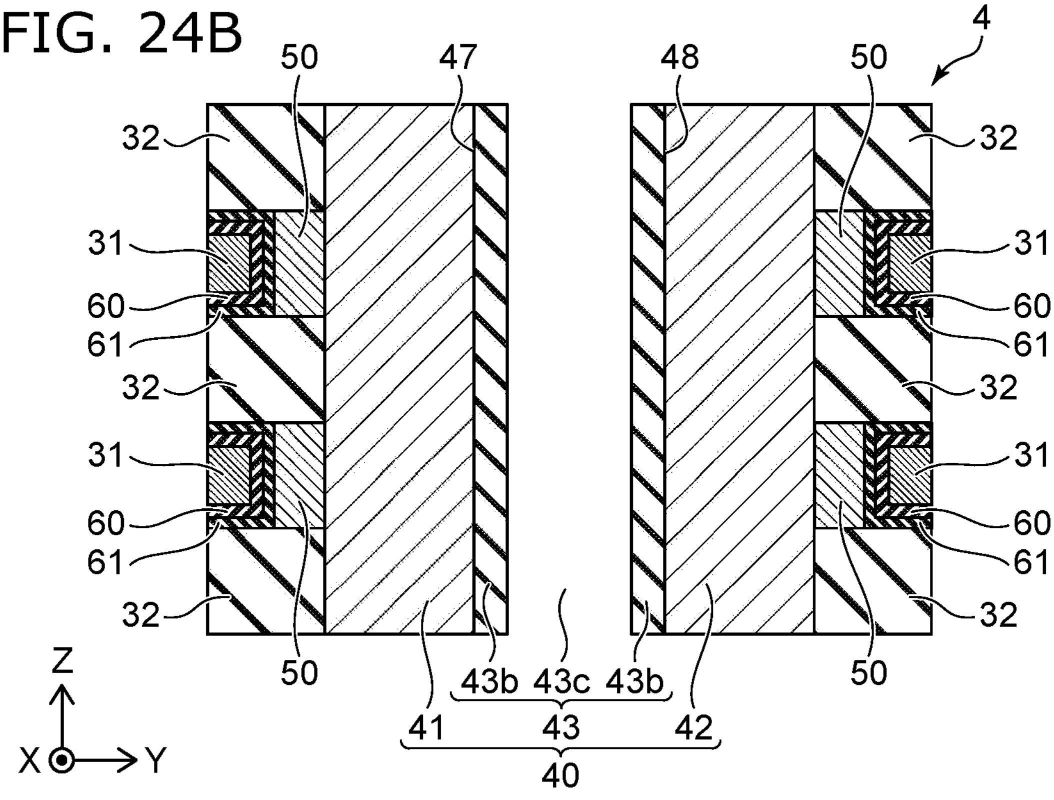

FIGS. 24A and 24B are partially enlarged cross-sectional views showing semiconductor memory device 4, according to a fourth embodiment of the present invention. In particular, FIG. 24A shows a region corresponding to region C of semiconductor memory device 1 of FIG. 2; and FIG. 24B shows a region corresponding to region D of semiconductor memory device 1 of FIG. 3.

As shown in FIGS. 24A-24B, semiconductor memory device 4 differs from semiconductor memory device 3 in that an air gap **43*c* is formed, instead of core insulating pillar 43*a*. A gas (e.g., ambient air, or an inert gas) may fill air gap 43*c*. As described above, liner insulating film 43*b* contacts source pillar 41, drain pillar 42, and semiconductor member 50. Air gap 43*c* is separated from source pillar 41, drain pillar 42, and semiconductor member 50 by liner insulating film 43*b***.

Providing air gap **43*c* in insulator pillar 43 reduces the parasitic capacitance between source pillar 41 and drain pillar 42, between source pillar 41 and semiconductor member 50 (i.e., a channel region), and between drain pillar 42** and semiconductor member 50. As a result, a higher speed is achieved in memory cell transistor 100. This fourth embodiment achieves otherwise substantially the same configuration, the same operations, and the same effects as the first embodiment described herein. Also, this fourth embodiment may be manufactured using substantially the same method as that for manufacturing the first embodiment described herein.

Fifth Embodiment

Figure 25A:
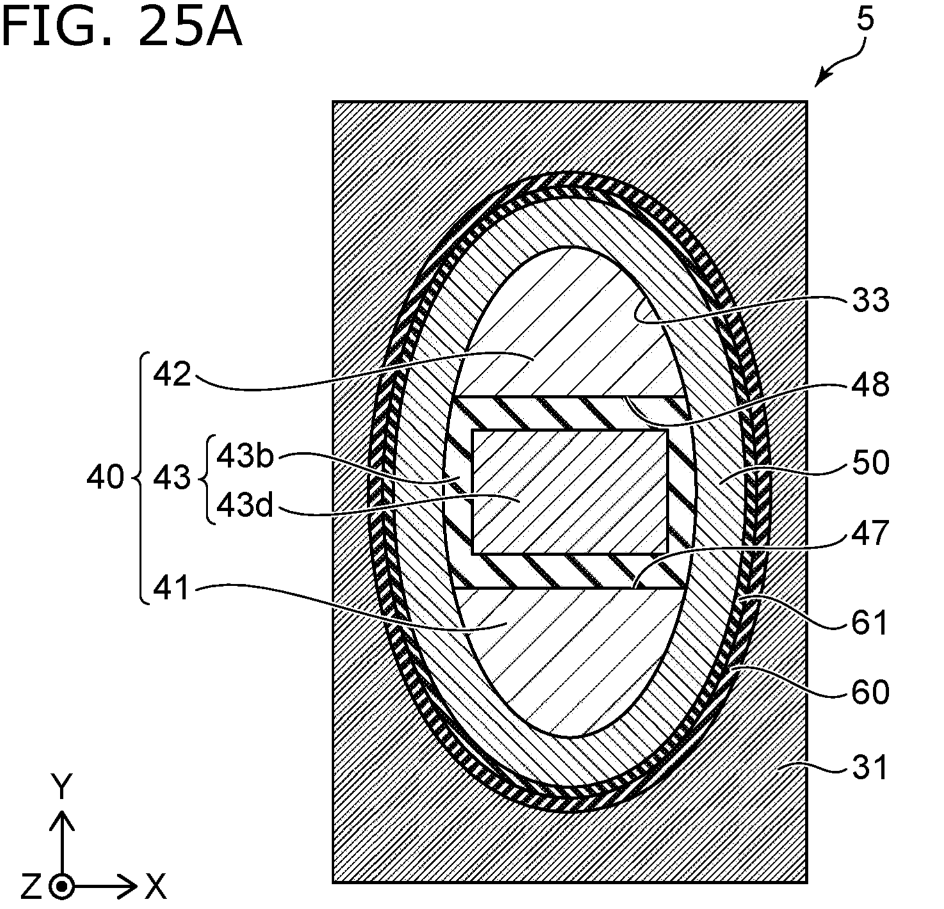
FIGS. 25A and 25B are partially enlarged cross-sectional views showing semiconductor memory device 5, according to a fifth embodiment of the present invention.
Figure 25B:
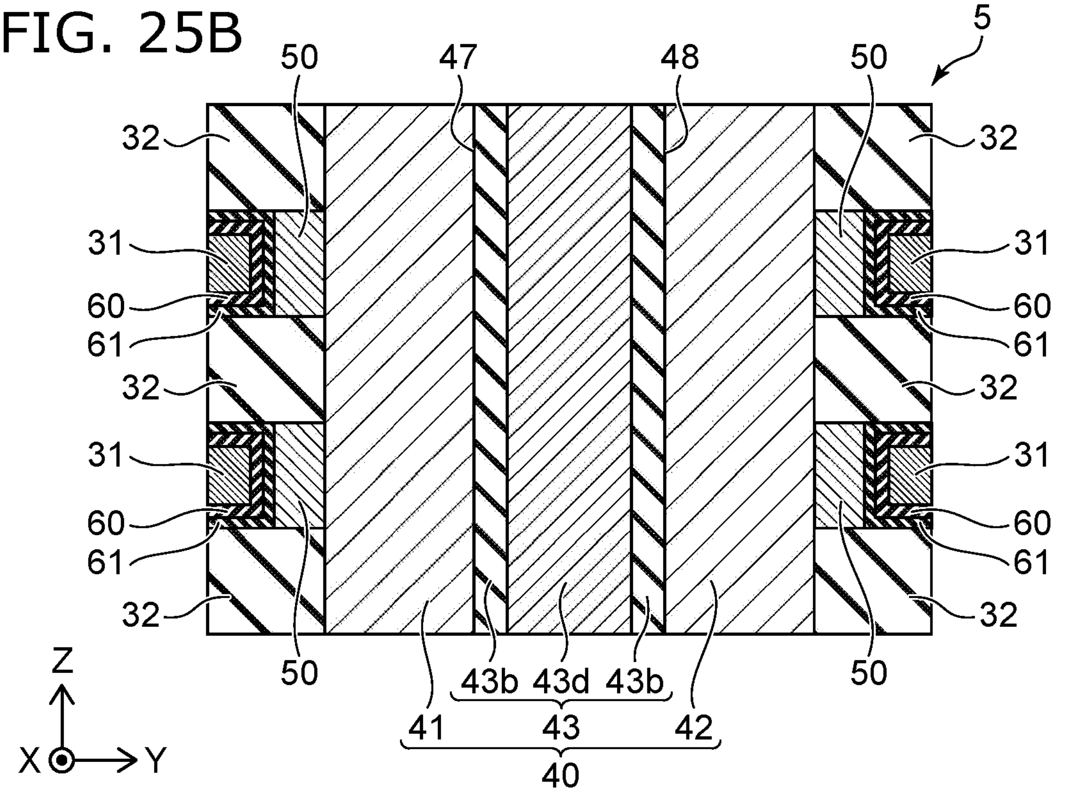

FIGS. 25A-25B are partially enlarged cross-sectional views showing semiconductor memory device 5, according to a fifth embodiment of the present invention. FIG. 25A shows a region corresponding to region C of semiconductor memory device 1 of FIG. 2; and FIG. 25B shows a region corresponding to region D of semiconductor memory device 1 of FIG. 3.

As shown in FIGS. 25A-25B, semiconductor memory device 5 differs from semiconductor memory device 3 in that core metal pillar 43*d* is included, instead of core insulating pillar 43*a*. Core metal pillar 43*d* may be made of a conductive material (e.g., titanium nitride (TiN), or tungsten (W)). As described above, liner insulating film 43*b* contacts source pillar 41, drain pillar 42, and semiconductor member 50. Core metal pillar 43*d* is separated from source pillar 41, drain pillar 42, and semiconductor part 50 by liner insulating film 43*b*. The upper end portion or the lower end portion of core metal pillar 43*d* connects to an interconnect (not illustrated).

Oxide semiconductors have large bandgaps. Also, holes are substantially not generated in oxide semiconductors, so that, when semiconductor member 50 is formed out of an oxide semiconductor, it is possible that a suitable electric field may not be efficiently applied to ferroelectric layer 60. By providing core metal pillar 43*d* instead of insulator pillar 43, core metal pillar 43*d* may serve as a back gate of memory cell transistor 100. As a result, core metal pillar 43*d* and electrode film 31 can effectively apply a suitable electric field to ferroelectric layer 60, enabling reliable polarization in ferroelectric layer 60. This fifth embodiment achieves otherwise substantially the same configuration, the same operations, and the same effects as the first embodiment described herein. Also, this fifth embodiment may be manufactured using substantially the same method as that for manufacturing the first embodiment described herein.

Further Embodiments

According to yet other embodiments of the present invention, source pillars 41 and drain pillars 42 may be formed using a metallic material (e.g., tungsten, often with a barrier or an adhesive liner, such as titanium nitride (TiN)). For those embodiments, through-hole 33 may be first filled with a suitable sacrificial material (e.g., silicon nitride (SiN), silicon carbon (SiC), amorphous silicon). Thereafter, a photo-lithographical step masks and remove the sacrificial material from a central portion of through-hole 33, in a similar manner as described above in conjunction with FIGS. 13A-13B. Then, an insulating material (e.g., silicon oxide) is deposited in the excavated cavity to form insulator pillar 43. The remaining sacrificial material in through-hole 33 may be removed and replaced by a metallic material in a subsequent step to provide source pillar 41 and drain pillar 42. To allow effective removal of the sacrificial material, the sacrificial material is preferably selected to have a substantial etch selectivity to the material in insulator pillar 43.

Alternatively, rather than filling through-hole 33 with the sacrificial material or the target material for source pillars 41 and drain pillars 42, through-hole 33 may be filled initially with the target insulator material for insulator pillar 43 and then excavated subsequently where source pillars 41 and drain pillar 43 are intended in photo-lithographical step. The excavated cavities may then be filled with the sacrificial material (e.g., for metal source and drain pillars) or target source and drain materials (e.g., for polysilicon source and drain pillars).

The embodiments of the present invention described herein are merely exemplary and is not limited to be limiting of the present invention. Numerous modification and variations within the scope of the present invention are possible. For example, the materials of the components are not limited to the examples described above. Also, conductivity types of source pillar 41, drain pillar 42, and semiconductor member 50 may be reversed. Furthermore, in this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The scope of the invention is limited only by the claims and the invention encompasses numerous alternatives, modifications, and equivalents. For clarity, technical material that is known in the technical fields related to the invention has not been described in detail so that the invention is not unnecessarily obscured. The present invention is defined by the appended claims.

The invention claimed is:

1. A memory device, comprising:

a stacked body comprising a plurality of alternately provided conductor-including layers and insulating films, provided one on top of another along a first direction; and a plurality of pillar bodies, each pillar body being formed within the stacked body and comprising (i) first and second conductive pillars each extending along the first direction through the stacked body; and (ii) an insulator pillar provided between the first and second conductive pillars to separate the first and second conductive pillars in the pillar body;

wherein the conductor-including layers each comprises (i) adjacent each pillar body, a semiconductor member in contact with the first and second conductive pillars, wherein each semiconductor member is in an annular or a ring form and is provided only surrounding each respective pillar body and is absent between adjacent pillar bodies; (ii) an electrode film and (iii) a ferroelectric layer between the semiconductor member and the electrode film and also between each electrode film and the adjacent insulating film in the stacked body, the ferroelectric layer separating the electrode film in each conductor-including layer from the adjacent insulating film along the first direction;

wherein the first and second conductive pillars in each pillar body contact alternately, along the first direction, (i) the semiconductor member in the conductor-including layer and (ii) the insulating films; and wherein the semiconductor members in the plurality of conductor-including layers are separated from each other by the insulating films in the first direction.

2. The memory device of claim 1, wherein the first and second conductive pillars each comprise a semiconductor material of a first conductivity and wherein the semiconductor member comprises a semiconductor material of a second conductivity opposite the first conductivity.

3. The memory device of claim 1, wherein the first and second conductive pillars each comprise a metallic material and wherein the semiconductor member comprises an oxide semiconductor.

4. The memory device of claim 3, wherein the oxide semiconductor comprises one or more of: indium gallium zirconium oxide (IGZO), indium tungsten oxide (IWO), indium zinc oxide (IZO), indium tin oxide (ITO) and indium gallium zinc oxide (IGZTO).

5. The memory device of claim 1, wherein the ferroelectric layer comprises one or more of: hafnium zirconium oxide (HfZrO), hafnium silicon oxide (HfSiO), hafnium aluminum oxide (HfAlO), lead zirconate titanate (PZT), zirconium-doped hafnium oxide (HZO), silicon-doped hafnium oxide (HSO), aluminum zirconium-doped Hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO) and any hafnium oxide that includes zirconium impurities.

6. The memory device of claim 1, wherein the insulator pillar comprises an insulating material of a single composition.

7. The memory device of claim 1, wherein the insulator pillar comprises a core metal pillar electrically isolated from the first and second conductive pillars by a liner insulating film.

8. The memory device of claim 1, wherein the insulator pillar comprises a liner insulating film enclosing an air gap.

9. The memory device of claim 1, wherein, as seen in a cross section of the pillar body that is normal to the first direction, the first conductive pillar and the insulator pillar has a first interface and the second conductive pillar and the insulator pillar has a second interface, the first and second interfaces being substantially parallel lines.

10. The memory device of claim 1, the memory device being formed on a substrate, the memory device further comprising a plurality of interconnect conductors, wherein the first conductive pillar contacts the substrate, and the second conductive pillar is connected to one of the interconnect conductors.

11. The memory device of claim 10, further comprising:
- a conductive plate that has a substantially planar surface that extends in both the first direction and a second direction orthogonal to the first direction, thereby dividing the stacked body along a third direction that is orthogonal to both the first and the second directions; and
- an insulating plate between the conductive plate and the stacked body, electrically isolating the conductive plate from the stacked body.

12. The memory device of claim 11, wherein the substrate is conductive and the conductive plate is electrically connected to the substrate.

13. The memory device of claim 11, wherein the interconnect conductors each extend along the third direction, wherein the pillar bodies are organized as columns arranged along the third direction, the pillar bodies within each column being arranged along the second direction and wherein adjacent pillar bodies in adjacent columns are offset along the second direction, such that the adjacent pillars are positioned to be contacted by separate ones of the interconnect conductors.

14. The memory device of claim 11, wherein the pillar bodies are each elliptical having a major axis forming an oblique angle relative to the second direction.

15. The memory device of claim 14, wherein the oblique angle is between 3 degrees and 45 degrees, and preferably between 10 degrees and 20 degrees.

* * * * *